United States Patent
Takeuchi et al.

(10) Patent No.: US 11,955,791 B2
(45) Date of Patent: Apr. 9, 2024

(54) SHORT-CIRCUIT DETECTOR AND POWER CONVERTER

(71) Applicant: FUJI ELECTRIC CO., LTD., Kawasaki (JP)

(72) Inventors: Natsuko Takeuchi, Hino (JP); Kunio Matsubara, Hino (JP); Hiromu Takubo, Hachioji (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 238 days.

(21) Appl. No.: 17/681,371

(22) Filed: Feb. 25, 2022

(65) Prior Publication Data
US 2022/0190590 A1 Jun. 16, 2022

Related U.S. Application Data

(63) Continuation of application No. PCT/JP2021/010877, filed on Mar. 17, 2021.

(30) Foreign Application Priority Data

Mar. 18, 2020 (JP) .................................. 2020-048102
Jan. 21, 2021 (JP) .................................. 2021-008338

(51) Int. Cl.
| | |
|---|---|
| H02M 7/537 | (2006.01) |
| G01R 15/18 | (2006.01) |
| G01R 19/00 | (2006.01) |
| G01R 31/52 | (2020.01) |
| H02H 1/00 | (2006.01) |
| H02H 7/122 | (2006.01) |
| H02M 1/088 | (2006.01) |

(52) U.S. Cl.
CPC ......... *H02H 7/1227* (2013.01); *G01R 15/181* (2013.01); *G01R 19/0092* (2013.01);
(Continued)

(58) Field of Classification Search
CPC ........ H02H 7/122; H02H 1/00; H02H 7/1227; H02H 1/0007; H02M 7/537; H02M 1/088; G01R 15/181; G01R 31/52
(Continued)

(56) References Cited

U.S. PATENT DOCUMENTS

2012/0068645 A1* 3/2012 Tsuji ....................... H02M 1/32
318/400.21
2022/0321026 A1* 10/2022 Hario .................. H02M 1/0009

FOREIGN PATENT DOCUMENTS

| JP | 2001169533 A | 6/2001 |
|---|---|---|
| JP | 2008301617 A | 12/2008 |

(Continued)

OTHER PUBLICATIONS

International Search Report (Form PCT/ISA/210); dated Apr. 20, 2021 in PCT Application No. PCT/JP2021/010877.
(Continued)

*Primary Examiner* — Danny Nguyen

(57) ABSTRACT

A short-circuit detector includes: a first Rogowski coil configured to generate a first detection signal in accordance with a current that flows through a first arm due to a short circuit in a load; a second Rogowski coil configured to generate a second detection signal in accordance with a current that flows through the first arm due to a short circuit in the first arm or a second arm; a load short-circuit detection circuit configured to detect the short circuit in the load, based on the first detection signal; an arm short-circuit detection circuit configured to detect the short circuit in the first arm or the second arm, based on the second detection signal; and a short-circuit detection circuit configured to detect a short-circuit, based on: an output signal output from the load short-circuit detection circuit; and an output signal output from the arm short-circuit detection circuit.

18 Claims, 18 Drawing Sheets

(52) U.S. Cl.
CPC ........... *G01R 31/52* (2020.01); *H02H 1/0007* (2013.01); *H02M 1/088* (2013.01); *H02M 7/537* (2013.01)

(58) Field of Classification Search
USPC .................................. 361/86–87, 93.7–93.9
See application file for complete search history.

(56) References Cited

FOREIGN PATENT DOCUMENTS

| | | |
|---|---|---|
| JP | 2019216540 A | 12/2019 |
| JP | 2008118834 A | 5/2022 |
| WO | 2017150726 A1 | 9/2017 |
| WO | 2018073909 A1 | 4/2018 |

OTHER PUBLICATIONS

Written Opinion (Form PCT/ISA/237); dated Apr. 20, 2021 in PCT Application No. PCT/JP2021/010877.
Notice of Reasons for Refusal dated Oct. 20, 2020 in Japanese Patent Application No. 2020-048102.
Notice of Reasons for Refusal dated Feb. 24, 2021 in Japanese Patent Application No. 2020-048102.

\* cited by examiner

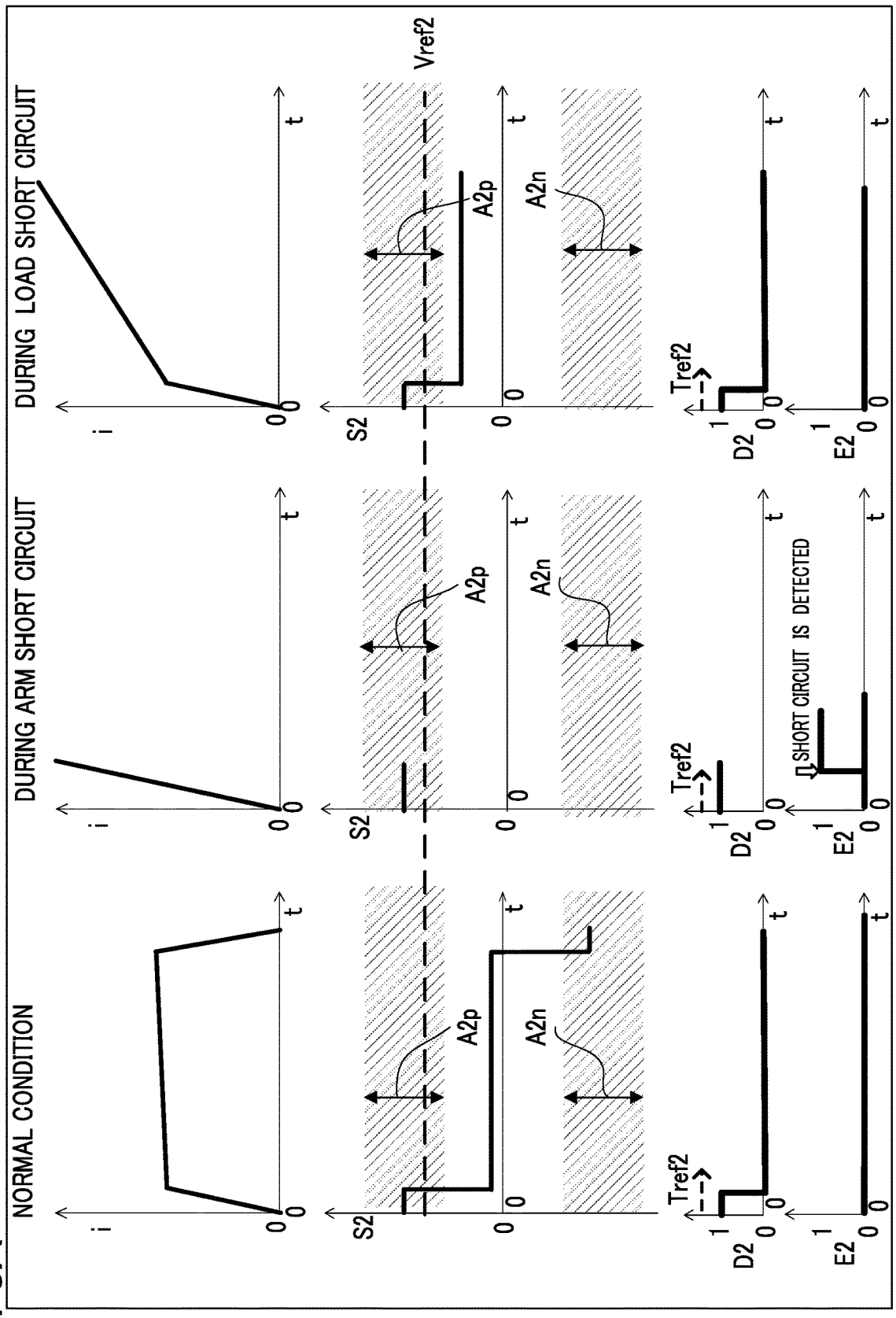

SHORT-CIRCUIT DETECTOR AND POWER CONVERTER

CROSS REFERENCE TO RELATED APPLICATIONS

This Application is a Continuation Application of PCT Application No. PCT/JP2021/010877, filed on Mar. 17, 2021, and is based on and claims priority from Japanese Patent Applications: (i) No. 2020-048102 filed on Mar. 18, 2020; and (ii) No. 2021-008338 filed on Jan. 21, 2021, the entire contents of each of which are incorporated herein by reference.

BACKGROUND

Field of the Invention

The present invention relates to short-circuit detectors, and to power converters.

Description of Related Art

In a power converter that drives a load, such as a motor, in some cases, an overcurrent flows through a semiconductor switch of the power converter. If such an overcurrent flows for a long period of time, the semiconductor switch may be damaged. Thus, a short-circuit detector is provided in the power converter. The short-circuit detector detects an overcurrent flowing through a semiconductor switch, and then stops the power converter.

In this type of short-circuit detector, a shunt resistor, a Current Transformer (CT), or a Rogowski coil is used to detect a current flowing in a semiconductor switch. Among these components, the Rogowski coil does not have a core, as a result of which provision of small short-circuit detectors and detection of an overcurrent are achieved.

Patent Document 1 (Japanese Patent Application Laid-Open Publication No. 2001-169533) relates to a power converter that drives a load through an arm (an arm circuit) including a semiconductor switch, and discloses that a short circuit in the arm is detected by way of a Rogowski coil.

FIG. 17 is a circuit diagram of a device disclosed in Patent Document 1. In FIG. 17, a gate drive circuit 96 supplies a gate voltage to a semiconductor switch 91 via a gate resistor 95 to drive the semiconductor switch 91. The Rogowski coil 97 generates (outputs) a voltage across the terminals, which is proportional to a time gradient di/dt of a current flowing through the semiconductor switch 91. The short-circuit detector 98 detects that a large voltage across the terminals of the Rogowski coil 97 has continued over a certain period of time. In such a case, the short-circuit detector 98 determines that an arm short circuit has occurred, and then causes the gate drive circuit 6 to stop driving the semiconductor switch 91.

However, examples of short circuits that may occur in the power converter include not only arm short circuits, but also load short circuits. The load short circuits may occur in the load connected to an output of the power converter. Thus, Patent Document 2 (WO 2018/073909) discloses a technique for detecting an arm short-circuit current by an air core coil and detecting a load short-circuit current by a current transformer (CT).

The technique disclosed in Patent Document 1 is effective in detecting arm short circuits, but it is difficult to detect load short circuits. Description will be given of this problem.

FIG. 18 is a circuit diagram showing a short-circuit current route RT1 in a power converter during an arm short circuit. FIG. 19 is a circuit diagram showing a short-circuit current route RT2 in the power converter during a load short circuit.

In the power converter shown in FIGS. 18 and 19, two arms are connected in series to each other, and they are disposed between both terminals of a capacitor CE that is charged up to a DC voltage Ev. One of the two arms includes a semiconductor switch SW1 and a flywheel diode DI1, which are connected in inverse parallel to each other. The other arm includes a semiconductor switch SW2 and a flywheel diode DI2, which are connected in inverse parallel to each other. Furthermore, two arms are connected in series to each other, and they are disposed between both terminals of the capacitor CE. One of the two arms includes a semiconductor switch SW3 and a flywheel diode DI3, which are connected in inverse parallel to each other. The other arm includes a semiconductor switch SW4 and a flywheel diode DI4, which are connected in inverse parallel to each other. A load Z (e.g., a motor winding) is connected between the common connection nodes 99_1 and 99_2. The common connection node 99_1 is between the semiconductor switches SW1 and SW2. The common connection node 99_2 is between the semiconductor switches SW3 and SW4. In FIGS. 18 and 19, the "L1" represents a self-inductance existing in the short-circuit current route during an arm short circuit. The "L2" represents a self-inductance existing in a current route from the common connection node 99_1 to the common connection node 99_2 through the load Z.

In the power converter, two semiconductor switches (e.g., SW1 and SW2) connected in series to each other are controlled such that they do not turn on at the same time, to avoid a short circuit in the power supply. However, for some reason, the semiconductor switches may fail or it may malfunction. Similarly, the flywheel diodes may fail. In such a case, an arm short circuit described below will occur. In the example shown in FIG. 18, a case will be described in which the semiconductor switch SW1 or the flywheel diode DI1 has failed for some reason. In FIG. 18, "X (cross)" mark shown represents failures of these components. This is also the case for FIG. 19. When the semiconductor switch SW2 is set to ON, the semiconductor switch SW1 is set to OFF. However, if the semiconductor switch SW1 is unintentionally turned on, and the semiconductor switch SW2 is turned on for some reason, an arm short circuit occurs. In this case, an arm short-circuit current ia flows through the current route RT1. This is also the case in which a reverse current flows through the flywheel diode DI1 for some reason. In such a case, the arm short-circuit current ia flows in the following order:

Capacitor CE→semiconductor switch SW1→semiconductor switch SW2→Capacitor CE.

In this case, the following formula is established for the arm short-circuit current ia.

$$Ev = L1 \times dia/dt. \tag{1}$$

As with the semiconductor switches, a short circuit in the load may occur for some reason.

In the example shown in FIG. 19, a case will be described in which a short circuit in the load Z has occurred when the semiconductor switches SW1 and SW4 are ON, and semiconductor switches SW2 and SW3 are OFF. In this case, the load short-circuit current ir flows through the current route RT2. Specifically, the load short-circuit current ir flows in the following order:

Capacitor CE→Semiconductor switch SW1→Load Z→Semiconductor switch SW4→Capacitor CE.

In this case, the following formula is established for the load short-circuit current ir.

$$Ev = (L1 + L2) \times dir/dt. \qquad (2)$$

Here, the relationship between self-inductances L1 and L2 is L1<<L2. Thus, from the formulas (1) and (2), it is clear that the following formula is established.

$$dir/dt << dia/dt. \qquad (3)$$

FIG. 20 shows waveforms of an arm short-circuit current ia and a load short-circuit current ir. In FIG. 20, the horizontal axis represents time t and the vertical axis represents current (current value) i.

First, the arm short-circuit current ia shown in FIG. 18 will be described. The self-inductance L1 existing in the route RT1 of the arm short-circuit current ia is small. For this reason, if semiconductor switch SW2 is turned on at t=0, the arm short-circuit current ia rises sharply, the value of which increases within a short period of time. As a result, charges stored in the capacitor CE are discharged in a short period of time, and the arm short-circuit current ia is generated within a short period of time after the semiconductor switch SW2 is turned on. In contrast, the self-inductance L2 existing in the route RT2 of the load short-circuit current ir is much greater than self-inductance L1. For this reason, the load short-circuit current ir increases with a very gentle time gradient after the semiconductor switches SW1 and SW4 are turned on. In the frequency domain, the frequency band of the arm short circuit has an upper frequency limit that is much higher than that of the load short-circuit current.

One approach to detect the load short-circuit current ir with small time gradient is to increase the number of turns of the Rogowski coil and to increase the sensitivity thereof. In this case, a detection of the load short-circuit current by the Rogowski coil results not only in an increase in size of the Rogowski coil, but also in increases in size and complexity of the power converter.

The large number of turns of the Rogowski coil results in higher self-inductance of the Rogowski coil. In this case, during both of the arm short circuit and the load short circuit, one approach to detect with accuracy the voltage across the terminals of the Rogowski coil is to lower the self-inductance of the Rogowski coil and to sufficiently increase the resonant frequency of a LC resonant circuit. Here, the LC resonant circuit includes a self-inductance and a parasitic capacitance of the Rogowski coil. In the sufficiently high resonant frequency, the resonant frequency needs to be higher than the upper frequency limit of the frequency band of the voltage across the terminals of the Rogowski coil during an arm short circuit. This is because the resonance frequency being within the frequency band causes distortion of the voltage waveform across the terminals of the Rogowski coil, as the result of which detection of an arm short circuit is difficult.

Thus, one approach to avoid effects of resonance is to decrease the self-inductance of the Rogowski coil and to increase the resonance frequency. However, decrease of the self-inductance of the Rogowski coil also results in decrease in the sensitivity of the Rogowski coil. The extremely small time gradient dia/dt of the load short-circuit current it causes the voltage across the terminals of the Rogowski coil to be buried in noise, as a result of which detection of a load short circuit is extremely difficult.

In the technique disclosed in Patent Document 2, an arm short-circuit current is detected by an air core coil, and a load short-circuit current is detected by a CT. However, the use of the CT increases cost and the number of discrete components, which results in increased complexity of the configuration of the power converter.

SUMMARY

This invention has been made in consideration of the problems described above, and it seeks to provide a technique for detecting at least a load short circuit from among an arm short circuit and a load short circuit by use of Rogowski coils.

A short-circuit detector according to a first aspect of the present invention is a short-circuit detector for a power converter including a plurality of arms, each including a semiconductor switch, the power converter supplying power to a load through the plurality of arms, the short-circuit detector including: a first Rogowski coil configured to generate a first detection signal in accordance with a load short-circuit current, the load short-circuit current being a current that flows through a first arm from among the plurality of arms due to a short circuit in the load; a second Rogowski coil configured to generate a second detection signal in accordance with an arm short-circuit current, the arm short-circuit current being a current that flows through the first arm due to: a short circuit in the first arm; or a short circuit in a second arm from among the plurality of arms; a load short-circuit detection circuit configured to detect the short circuit in the load, based on the first detection signal; an arm short-circuit detection circuit configured to detect the short circuit in the first arm or the short circuit in the second arm, based on the second detection signal; and a short-circuit detection circuit configured to detect a short-circuit, based on: an output signal output from the load short-circuit detection circuit; and an output signal output from the arm short-circuit detection circuit.

A short-circuit detector according to a second aspect of the present invention is a short-circuit detector for a power converter including a plurality of arms, each including a semiconductor switch, the power converter supplying power to a load through the plurality of arms, the short-circuit detector including: a Rogowski coil configured to generate a detection signal in accordance with a load short-circuit current, the load short-circuit current being a current that flows through a first arm from among the plurality of arms due to a short circuit in the load; a load short-circuit detection circuit configured to determine the short circuit in the load, based on the detection signal; and a short-circuit detection circuit configured to detect a short circuit, based on an output signal output from the load short-circuit detection circuit.

A power converter according to a third aspect of the present invention is a power converter including: a short-circuit detector according to the first aspect or the second aspect; and a gate drive circuit configured to stop driving a semiconductor switch included in the first arm, based on a short-circuit detection signal output from the short-circuit detector.

A power converter according to a fourth aspect of the present invention is a power converter for supplying power to a load through a plurality of P (P is an integer of 2 or more) arms, each including a semiconductor switch, the power converter including: a plurality of Q (Q is a positive integer that is less than P) short-circuit detector that correspond to respective ones of a plurality of Q arms from among the plurality of P arms, in which each of the plurality of Q short-circuit detectors is configured to: include a first Rogowski coil that is configured to output a first detection signal in accordance with a current flowing through a corresponding arm due to a short circuit in the load, and detect a short circuit based on the first detection signal.

A power converter according to a fifth aspect of the present invention is a power converter for supplying power to a load through an arm including a semiconductor switch, the power converter including: a first Rogowski coil that is configured to output a first detection signal in accordance with a current flowing through the arm due to a short circuit in the load; a second Rogowski coil that is configured to output a second detection signal in accordance with a current flowing through the arm due to a short circuit in a diode connected in series to the arm; and a short-circuit detector configured to detect a short circuit based on the first detection signal or the second detection signal.

In the first aspect of the present invention, an arm short-circuit current is detected by the second Rogowski coil, and a load short-circuit current is detected by the first Rogowski coil. As a result, the sensitivity of the first Rogowski coil can be set to a value suitable for detecting the load short-circuit current. Therefore, even if the self-inductance of the first Rogowski coil increases, this increase does not interfere with detection of an arm short-circuit current by the second Rogowski coil, as a result of which both an arm short-circuit and a load short-circuit are detected.

In the second aspect of the present invention, a load short-circuit current is detected by the first Rogowski coil. This enables a load short circuit to be detected.

In the third aspect of the present invention, there is provided a power converter that detects at least a load short circuit among a load short circuit and an arm short circuit.

In the fourth aspect of the present invention, there are provided short-circuit detectors, each including the first Rogowski coil, for respective ones of some of the plurality of arms. A load short-circuit current is detected by the first Rogowski coil. Since there are provided first Rogowski coils for some arms, a load short-circuit current is detected without increasing the size and complexity of the power converter.

In the fifth aspect of the present invention, the first Rogowski coil enables to a load short circuit to be detected. Furthermore, the second Rogowski coil enables a short circuit in a diode that is connected in series to an arm to be detected.

BRIEF DESCRIPTION OF THE DRAWINGS

FIG. 3A is a waveform diagram showing an example operation according to the first embodiment.

DESCRIPTION OF THE EMBODIMENTS

1. First Embodiment

Figure 1:
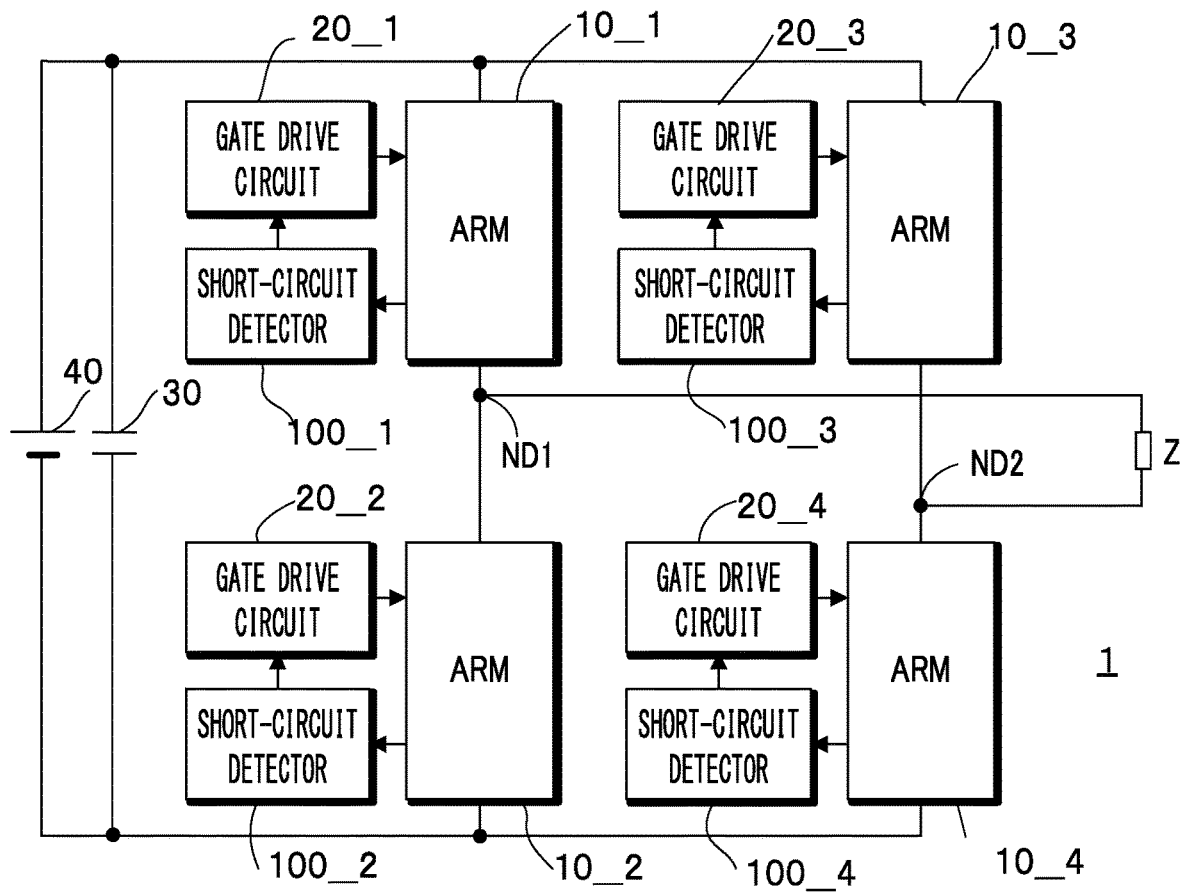
FIG. 1 is a circuit diagram showing a configuration of a power converter including a short-circuit detector according to a first embodiment.

Description will be given of the first embodiment with reference to the drawings. FIG. 1 is a circuit diagram showing a configuration of a power converter 1 including a short-circuit detector according to the first embodiment. In the power converter 1, a capacitor 30 is charged by a DC power supply 40 to stabilize a DC voltage. Arms 10_1 and 10_2 are connected in series to each other, and they are disposed between the two terminals of the capacitor 30. In addition, arms 10_3 and 10_4 are connected in series to each other, and they are disposed between the terminals. There is a common connection node ND1 between the arms 10_1 and 10_2. There is a common connection node ND2 between the arms 10_3 and 10_4. A load Z (e.g., a motor winding) is disposed between the common connection nodes ND1 and ND2, and is connected to these common connection nodes. Each of the arms 10_1 to 10_4 includes a semiconductor switch. Gate drive circuits 20_1 to 20_4 correspond to the arms 10_1 to 10_4, respectively. Each of the gate drive circuits 20_1 to 20_4 supplies a gate signal to a semiconductor switch of the corresponding arm, to control the semiconductor switch. Thus, the power converter 1 includes the arms 10_1 to 10_4, each of which includes a semiconductor switch, and supplies power to the load Z from a DC power supply 40 via these arms. Each of the arms 10_1 and 10_3 is an example of a "first arm", and each of the arms 10_2 and 10_4 is an example of a "second arm."

Here, attention will be focused on arm 10_1, and description will be given of an arm short circuit. To avoid a short circuit in the power supply, the two semiconductor switches 11_1 and 11_2 connected in series to each other are controlled such that they do not turn on at the same time. An example will be given in which the semiconductor switch 11_1 is set to ON and the semiconductor switch 11_2 is set to OFF. If a short circuit occurs in the arm 11_2 for some reason, and the semiconductor switch of the arm 10_1 is turned on, an unintended short circuit in the semiconductor switch 11_2 causes an arm short-circuit current flowing through the semiconductor switch of the arm 10_1. In addition, even if there is no short circuit in the arm 10_2, a short-circuit current flows through the semiconductor switch of the arm 10_1 due to a turning-on malfunction of the semiconductor switch of the arm 10_2. One of the causes of such a malfunction is noise. The above description is based on the fact that the semiconductor switch 10_1 is set to OFF and the semiconductor switch 11_2 is set to ON. In addition to the arm short circuit, if a short circuit occurs in the load Z for some reason, a load short-circuit current flows through the arm 10_1.

Such a short-circuit current or load short-circuit current flowing through the arm 10_1 for a long period of time may damage the normal semiconductor switch of the arm 10_1. Thus, there is provided a short-circuit detector 100_1 for the arm 10_1. The short-circuit detector 100_1 detects an arm short circuit or a load short circuit based on a current flowing in the arm 10_1, and causes the gate drive circuit 20_1 to stop driving the semiconductor switch. Similar arm short-circuit current and load short-circuit current may flow through other arms 10_2 to 10_4. Thus, there is provided a short-circuit detector 100_2 for the arm 10_2. There is provided a short-circuit detector 100_3 for the arms 10_3. There is provided a short-circuit detector 100_4 for the arms 10_4.

In the following description, when there is no need to distinguish each of the arms 10_1-10_4, the arms 10_1 to 10_4 will be collectively referred to as arm 10. The gate drive circuits 20_1 to 20_4 will be collectively referred to as gate drive circuit 20. The short-circuit detectors 100_1 to 100_4 will be collectively referred to as short-circuit detector 100.

Figure 2:
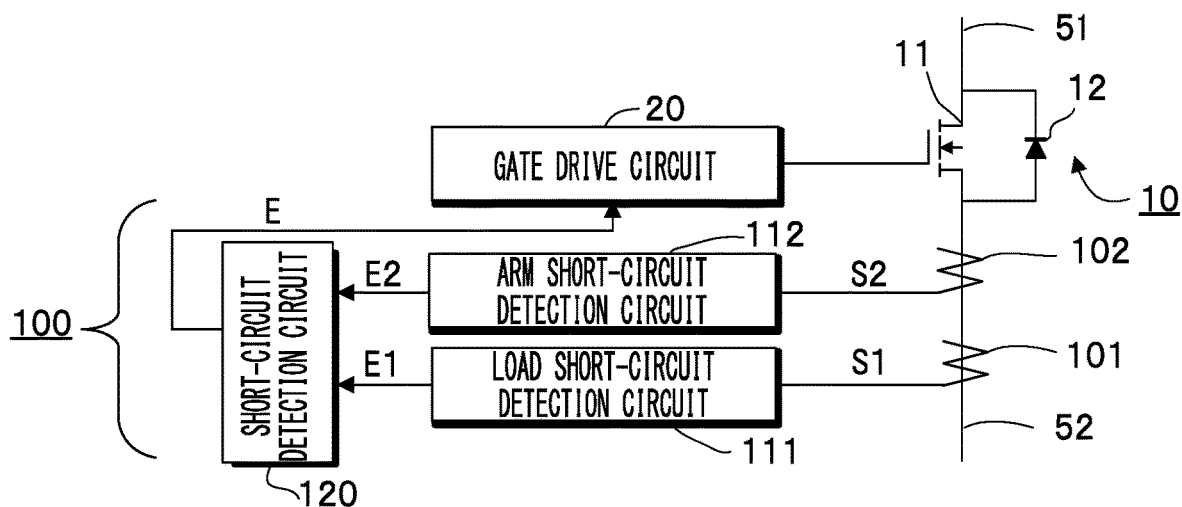
FIG. 2 is a circuit diagram showing an example configuration of a short-circuit detector according to the first embodiment.

FIG. 2 is a circuit diagram showing an example configuration of a short-circuit detector 100 according to the first embodiment. In FIG. 2, to clarify description of the short-circuit detector 100, an arm 10 and a gate drive circuit 20 are shown together with the short-circuit detector 100.

In FIG. 2, each of the arms 10_1 to 10_4 includes a semiconductor switch 11 and a flywheel diode 12 that is connected in inverse parallel thereto. In this example, the semiconductor switch 11 is a Metal Oxide Semiconductor Field Effect Transistor (MOSFET). The semiconductor switch 11 includes a source (a source electrode), a drain (a drain electrode), and a gate (a control electrode). The drain of the semiconductor switch 11 is connected to the capacitor 30 or the other arm via the conductor 51. The source of the semiconductor switch 11 is connected to the capacitor 30 or the other arm via the conductor 52. The gate of the semiconductor switch 11 is connected to the gate drive circuit 20. The gate drive circuit 20 supplies a gate signal to the gate of the semiconductor switch 11 to drive ON and OFF of the semiconductor switch 11.

In the example shown in FIG. 2, a conductor 52 is inserted into the first Rogowski coil 101 and the second Rogowski coil 102. Here, the first Rogowski coil 101 detects a load short-circuit current. The second Rogowski coil 102 detects an arm short-circuit current. In response to a current flowing through the conductor 52, a circular magnetic field is generated around the conductor 52 with the current at the center. A voltage corresponding to the time variation of the intensity of this magnetic field is induced in the first Rogowski coil 101 and the second Rogowski coil 102. As a result, a first detection signal S1 is output from the first Rogowski coil 101. The first detection signal S1 has a voltage waveform proportional to the time gradient di/dt of the current flowing in the conductor 52. Similarly, a second detection signal S2 is output from the second Rogowski coil 102. The second detection signal S2 has a voltage waveform proportional to the time gradient di/dt of the current flowing in the conductor 52.

In this embodiment, the first Rogowski coil 101 is optimized for detecting a load short-circuit current. The second Rogowski coil 102 is optimized for detecting an arm short-circuit current. Here, attention will be focused on the sensitivity to the time gradient di/dt of the current to be detected (i.e., a ratio of an output voltage of the Rogowski coil to the time gradient di/dt of the current). The sensitivity of the second Rogowski coil 102 is lower than that of the first Rogowski coil 101. Specifically, the number of turns of the second Rogowski coil 102 is less than that of the first Rogowski coil 101, the reason for which is as follows: If the self-inductance of the second Rogowski coil 102 is low, the resonant frequency of the LC resonant circuit, which includes the self-inductance and the parasitic capacitance of the second Rogowski coil 102, is high, and this resonant frequency is out of range of the frequency band of the arm short-circuit current frequency band. The first Rogowski coil 101 having higher sensitivity than the second Rogowski coil 102 enables the load short-circuit current with a small time gradient to be detected with accuracy.

An arm short-circuit detection circuit 112 detects an occurrence of an arm short circuit in the power converter 1, based on the second detection signal S2. Specifically, the arm short-circuit detection circuit 112 determines that an arm short circuit has occurred, when the second detection signal S2 is maintained at a level higher than a second reference level Vref2 beyond a second reference time Tref2. In response to detecting an arm short circuit, the arm short-circuit detection circuit 112 changes a short-circuit detection signal E2 from the inactive level "0" to the active level "1."

A load short-circuit detection circuit 111 detects an occurrence of a load short circuit in the power converter 1, based on the first detection signal S1. Specifically, the load short-circuit detection circuit 111 determines that a load short circuit has occurred when the first detection signal S1 is maintained at a level higher than a first reference level Vref1 beyond a first reference time Tref1. In response to detecting a load short circuit, the load short-circuit detection circuit 111 changes a short-circuit detection signal E1 from the inactive level "0" to the active level "1."

A short-circuit detection circuit 120 generates a short-circuit detection signal E, based on (i) the short-circuit detection signal E2 output by the arm short-circuit detection circuit 112 and (ii) the short-circuit detection signal E1 output by the load short-circuit detection circuit 111. The short-circuit detection signal E represents an occurrence of any short circuit in the power converter 1.

In this example, the short-circuit detection circuit 120 is an OR circuit. The short-circuit detection circuit 120 outputs, as the short-circuit detection signal E, a logical sum of the short-circuit detection signal E2 and the short-circuit detection signal E1. When the short-circuit detection signal E changes to the active level "1," the gate drive circuit 20 stops the driving of the semiconductor switch 11.

Figure 3B:
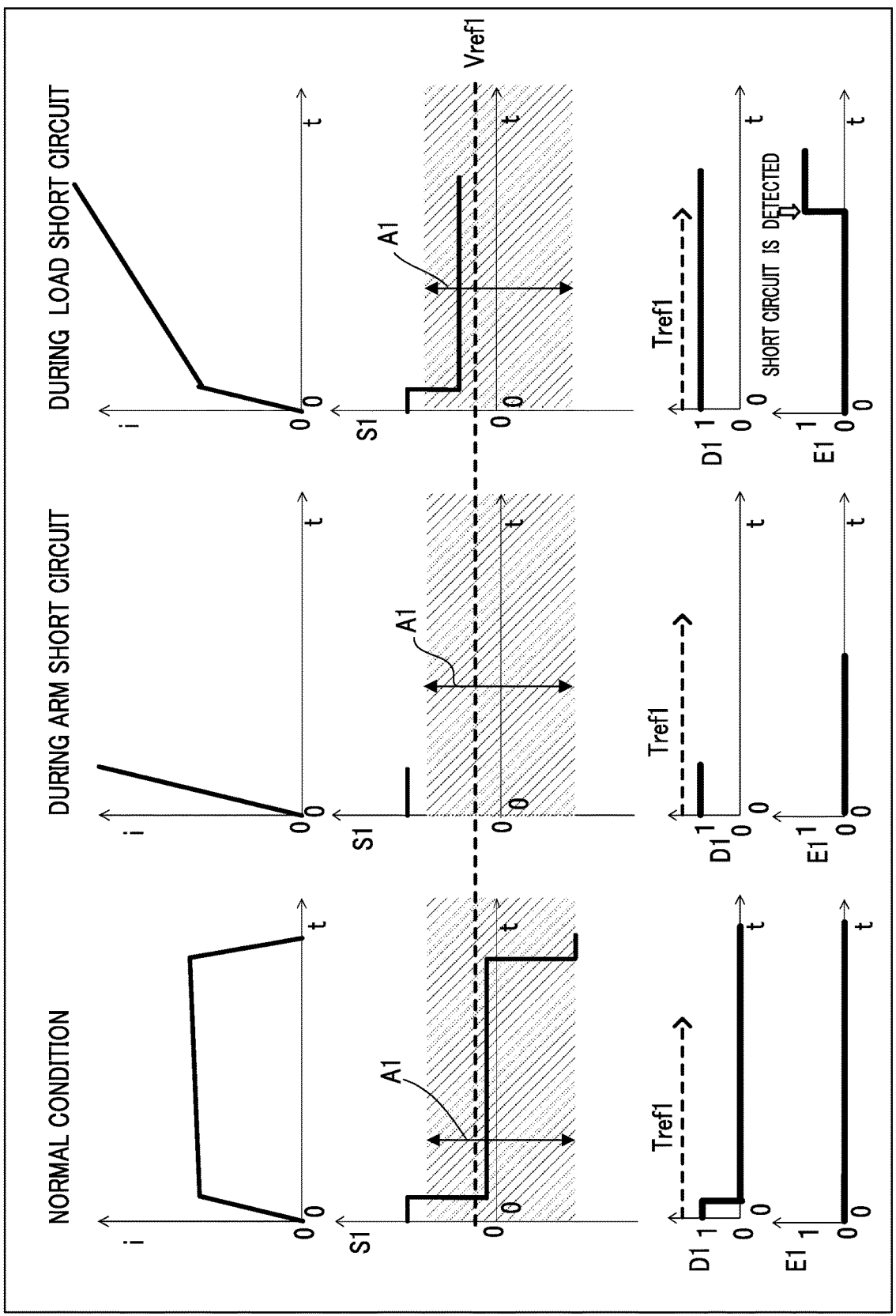
FIG. 3B is a waveform diagram showing an example operation according to the first embodiment.
Figure 3C:
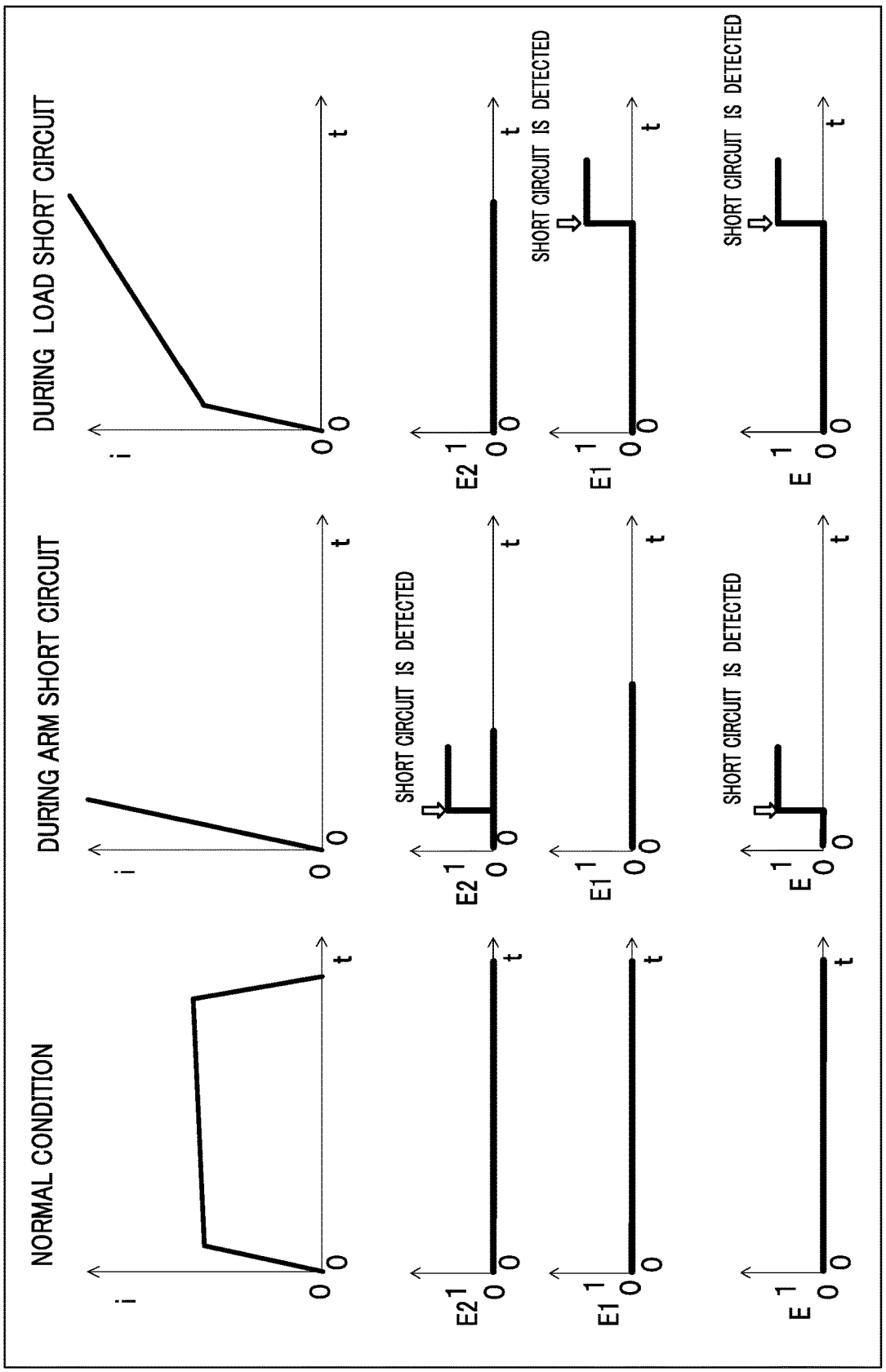
FIG. 3C is a waveform diagram showing an example operation according to the first embodiment.

FIGS. 3A, 3B, and 3C are each a waveform diagram showing an example operation according to the first embodiment.

In FIG. 3A, as to each of (a) during a normal condition, (b) during an arm short circuit, and (c) during a load short circuit, shown are (1) a waveform of a current i flowing through the conductor 52, (2) a waveform of the second detection signal S2, (3) a waveform of a level determination signal D2 generated in the arm short-circuit detection circuit 112, and (4) a waveform of the short-circuit detection signal E2 output by the arm short-circuit detection circuit 112.

In FIG. 3B, as to each of (a) during a normal condition, (b) during an arm short circuit, and (c) during a load short circuit, shown are (1) a waveform of a current i flowing through the conductor 52, (2) a waveform of the first detection signal S1, (3) a waveform of a level determination signal D1 generated in the load short-circuit detection circuit 111, and (4) a waveform of the short-circuit detection signal E1 output by the load short-circuit detection circuit 111.

In FIG. 3C, as to each of (a) during a normal condition, (b) during an arm short circuit, and (c) during a load short circuit, shown are (1) a waveform of a current i flowing through the conductor 52, (2) a waveform of the short-circuit detection signal E2 output by the arm short-circuit detection circuit 112, (3) a waveform of the short-circuit detection signal E1 output by the load short-circuit detection circuit 111, and (4) a waveform of the short-circuit detection signal E output by the short-circuit detection circuit 120.

In these drawings, the horizontal axis represents time t, and the vertical axis represents voltage, current, and truth value.

First, description will be given of the operation of the arm short-circuit detection circuit 112 with reference to FIG. 3A. The arm short-circuit detection circuit 112 compares the second detection signal S2 outputted from the second Rogowski coil 102 with the second reference level Vref2. When the second detection signal S2 exceeds the second reference level Vref2, the arm short-circuit detection circuit 112 sets the level determination signal D2 to the active level "1." During an arm short circuit, a current i with a large time gradient di/dt flows through the conductor 52. Accordingly, the arm short-circuit detection circuit 112 is needed to detect such a large time gradient di/dt. For this reason, the second reference level Vref2 has a sufficiently large voltage that is appropriate for comparison with the second detection signal S2 during the arm short circuit. Furthermore, the arm short-circuit detection circuit 112 sets the short-circuit detection signal E2 to the active level "1," when the level determination signal D2 is maintained at the active level "1" beyond the second reference time Tref2. During an arm short circuit, the current i, which has a large time gradient di/dt and flows in the conductor 52, is sufficient to cause the semiconductor switch 11 to fail instantaneously. As a result, during the arm short circuit, a time during which the current i with a large time gradient di/dt flows through the conductor 52 is short. For this reason, the second reference time Tref2 is short sufficient to to detect an arm short circuit (e.g., on the order of 10 ns to 100 ns).

During a normal condition, the current i flowing through the conductor 52 rises by turning on the semiconductor switch 11. In the rising period of the current i, the second detection signal S2, which represents the time gradient di/dt of the current i, exceeds the second reference level Vref2, and the level determination signal D2 is maintained at the active level "1." However, the rising period of the current i is short. Furthermore, the period of time during which the level determination signal D1 is maintained at the active level "1" is less than the second reference time Tref2. Accordingly, the short-circuit detection signal E2 never changes to the active level "1."

During a load short circuit, the current i flowing through the conductor 52 rises by turning on the semiconductor switch 11. Thereafter, the current i increases with a time gradient, which is determined by the self-inductance existing in the route of the load short-circuit current. In this case, in the rising period of the current i, the second detection signal S2 exceeds the second reference level Vref2. However, the rising period of the current i is as short as it is during the normal condition. In addition, a period of time during which the level determination signal D2 is maintained at the active level "1" is shorter than the second reference time Tref2. Accordingly, the short-circuit detection signal E2 never changes to the active level "1."

The operation of the arm short-circuit detection circuit 112 during an arm short circuit is as follows:

A case will be explained in which a short circuit has occurred in another arm 10 connected in series to the semiconductor switch 11 due to a turning-on of the semiconductor switch 11 of each of the arms 10. In this case, the current i flowing through the conductor 52 rises with a time gradient, which is determined by the self-inductance existing in the route of the current i. As a result, the second detection signal S2 exceeds the second reference level Vref2, and the level determination signal D2 changes to the active level "1." In this case, the rising period of the current i is longer than that during the normal condition. Furthermore, the level determination signal D2 is maintained at the active level "1" beyond the second reference time Tref2. For this reason, the short-circuit detection signal E2 changes to the active level "1."

In this example, the second Rogowski coil 102 detects, with high accuracy, the time gradient di/dt of the current in which the second detection signal S2 falls within the range A2p or A2n.

The second reference level Vref2 is within the range A2p. Accordingly, the arm short-circuit detection circuit 112 can detect an arm short circuit with high accuracy.

Next, description will be given of the operation of the load short-circuit detection circuit 111 with reference to FIG. 3B. The load short-circuit detection circuit 111 compares the first detection signal S1 output from the first Rogowski coil 101 with the first reference level Vref1. When the first detection signal S1 exceeds the first reference level Vref1, the load short-circuit detection circuit 111 sets the level determination signal D1 to the active level "1." During load short circuit, a current i with a small time gradient di/dt flows through the conductor 52. Accordingly, the load short-circuit detection circuit 111 is needed to detect such a small time gradient di/dt. For this reason, the first reference level Vref1 is a small voltage sufficient to compare the first reference level Vref1 with the first detection signal S1 obtained during the load short circuit. Furthermore, the load short-circuit detection circuit 111 sets the short-circuit detection signal E1 to the active level "1," when the level determination signal D1 is maintained at the active level "1" beyond the first reference time Tref1. During a load short circuit, the time gradient di/dt of the current i flowing through the conductor 52 is longer than that during the normal condition and an arm short circuit. For this reason, the first reference time Tref1 is set to a sufficiently long time, which is defined such that the normal operation or an arm short circuit will not be acknowledged as a load short circuit (e.g., tens to hundreds of times longer than the reference time Tref1).

During the normal condition, a current i flowing through the conductor 52 rises due to a turning-on of the semiconductor switch 11. Thereafter, in the rising period of the current i, the first detection signal S1, which represents the time gradient di/dt of the current i, exceeds the first reference level Vref1, and the level determination signal D1 changes to the active level "1."

However, the period of time during which the level determination signal D1 is maintained at the active level "1" is shorter than the first reference time Tref1. Accordingly, the short-circuit detection signal E1 never changes to the active level "1."

When a semiconductor switch connected in series to the semiconductor switch 11 has a short circuit failure, and the semiconductor switch 11 is turned on, an arm short circuit will occur. In this case, the current i flowing through the conductor 52 rises with a time gradient determined by the self-inductance existing in the route of the arm short-circuit current. As a result, the first detection signal S1 exceeds the first reference level Vref1, and the level determination signal D1 changes to the active level "1." However, during the arm short circuit, the second detection signal S2 exceeds the second reference level Vref2, and the level determination signal D2 changes to the active level "1." Here, there is a relationship between a time needed to detect an arm short circuit and a time needed to detect a load short circuit, which is defined by "Tref2<<Tref1." Accordingly, during an arm short, the short-circuit detection signal E2 changes to the active level "1" prior to the short-circuit detection signal E1, as a result of which a load short circuit resulted from an arm short circuit is never detected.

During a load short circuit, a current i flowing through the conductor 52 rises due to the turning-on of the semiconductor switch 11. Thereafter, the current i increases with a time gradient determined by the self-inductance existing in the route of the load short-circuit current. Thus, in the period of time during which the current i increases with a constant time gradient immediately after the rise of the current i, the first detection signal S1 exceeds the first reference level Vref1, and the level determination signal D1 changes to the active level "1." During the load short circuit, the level determination signal D1 is maintained at the active level "1" beyond the first reference time Tref1. Accordingly, the short-circuit detection signal E2 changes to the active level "1."

In this example, the first Rogowski coil 101 detects, with high accuracy, the current time gradient di/dt in which the first detection signal S1 falls within the range A1. The first reference level Vref1 is within the range A2. Accordingly, the first detection signal S1 generated by a load short circuit can be detected with high accuracy.

Next, description will be given of the operation of the short-circuit detection circuit 120 with reference to FIG. 3C. As shown in FIG. 3C, the short-circuit detection circuit 120 outputs, as the short-circuit detection signal E, the logical sum of the short-circuit detection signal E1 and the short-circuit detection signal E2. Accordingly, during an arm short circuit or a load short circuit, the short-circuit detection signal E is output to the gate drive circuit 20. As a result, driving of the semiconductor switch 11 is stopped by the gate drive circuit 20.

As in the foregoing description, according to this embodiment, use of a Rogowski coil enables both an arm short circuit and a load short circuit that will occur in a power converter to be detected accurately. Furthermore, according to this embodiment, no discrete components, such as a CT and the like, are used to detect a short circuit current, which reduces cost and avoids increasing size of the short circuit detector.

A variety of specific examples according to the first embodiment will be described below.

FIRST SPECIFIC EXAMPLE

A first specific example relates to two Rogowski coils. One of the Rogowski coils is a second Rogowski coil 102, which generates a second detection signal S2 that is an appropriate level during an arm short circuit. The other one is a first Rogowski coil 101, which generates a first detection signal S1 that is an appropriate level during a load short circuit. The same applies to second and third specific examples described below.

Figure 4:
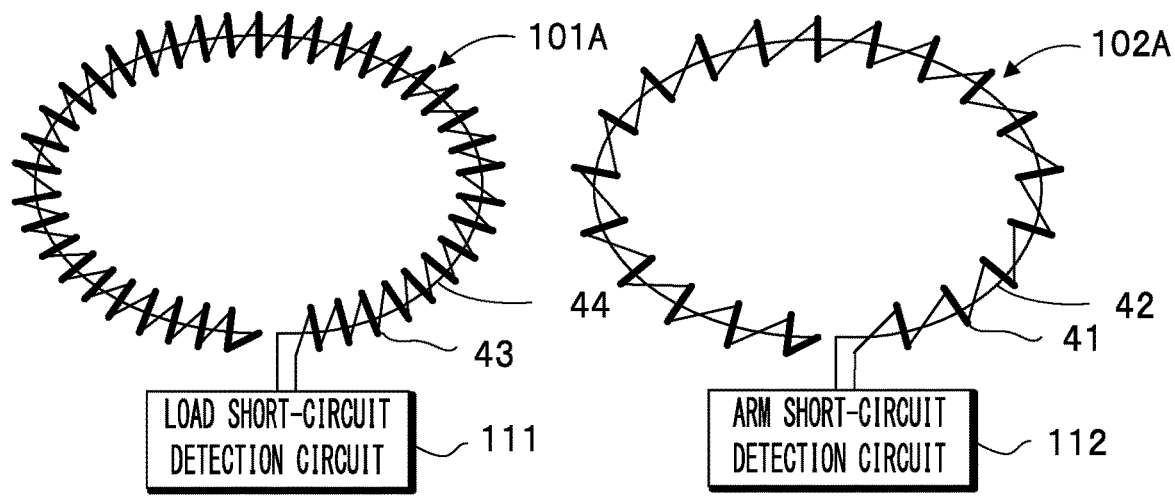
FIG. 4 is a diagram of a first specific example according to the first embodiment.

FIG. 4 is a diagram of the first specific example according to the first embodiment. In the specific example, the second Rogowski coil 102A for detecting an arm short circuit has a first portion 41 and a second portion 42. The first portion 41 is a toroidally coiled part from one end of a conductor (a wiring) to a given point of the conductor. The second portion 42 is a part in which a portion from the given point of the conductor to the other end passes through the toroidal coil, and the other end returns to the end. The first Rogowski coil 101A for detecting a load short circuit includes a first portion 43 similar to the first portion 41, and a second portion 44 similar to the second portion 42. In the first specific example, the number of turns n2 of the second Rogowski coil 102A for detecting an arm short circuit differs from the number of turns n1 of the first Rogowski coil 101A for detecting a load short circuit. Specifically, there is a relationship between the number of turns n2 of the first portion 41 of the second Rogowski coil 102A and the number of turns n1 of the first portion 43 of the first Rogowski coil 101A, which is defined by "n1>n2." The reasons for this will be described below.

A voltage v induced in each Rogowski coil is given by the following formula.

$$v = -\mu \cdot (SQ \cdot n / LG) \cdot (di/dt). \qquad (4)$$

Where, the "$\mu$" is magnetic permeability of air (the same as that of a vacuum). The "SQ" is a cross-sectional area across a magnetic path of a Rogowski coil. The "n" is the number of turns of the Rogowski coil. The "LG" is a magnetic path length of the Rogowski coil. The "di/dt" is a time gradient of a current i detected by the Rogowski coil. The cross-sectional area SQ refers to an area surrounded by the toroidal coil of the first portion (41 or 43) of the Rogowski coil. The magnetic path length refers to a length of a space surrounded by the toroidal coils of the Rogowski coil, and it is substantially same as that of the second portion (42 or 44).

Solving formula (4) for the number of turns n, the following formula is obtained.

$$n = -(LG \cdot v)/(\mu \cdot SQ \cdot (di/(dt))). \qquad (5)$$

According to Formula (5), in order to obtain a voltage v that is of a sufficient level from the Rogowski coil when the time gradient of the current di/dt is small, the number of turns n needs to be increased.

In the first specific example, the time gradient di/dt of the current to be detected is small, and therefore, the number of turns n1 of the first Rogowski coil 101A is greater than the number of turns n2 of the second Rogowski coil 102A. Specifically, in formula (5), the time gradient di/dt of the current during an arm short circuit is set to, for example, 10 times larger than that during a load short circuit, and thereby the number of turns n1 and n2 are calculated. The Rogowski coils 101A and 102A have the number of turns n1 and n2 calculated by equation (5), respectively, which enables both an arm short circuit and a load short circuit to be calculated with accuracy.

SECOND SPECIFIC EXAMPLE

Figure 5:
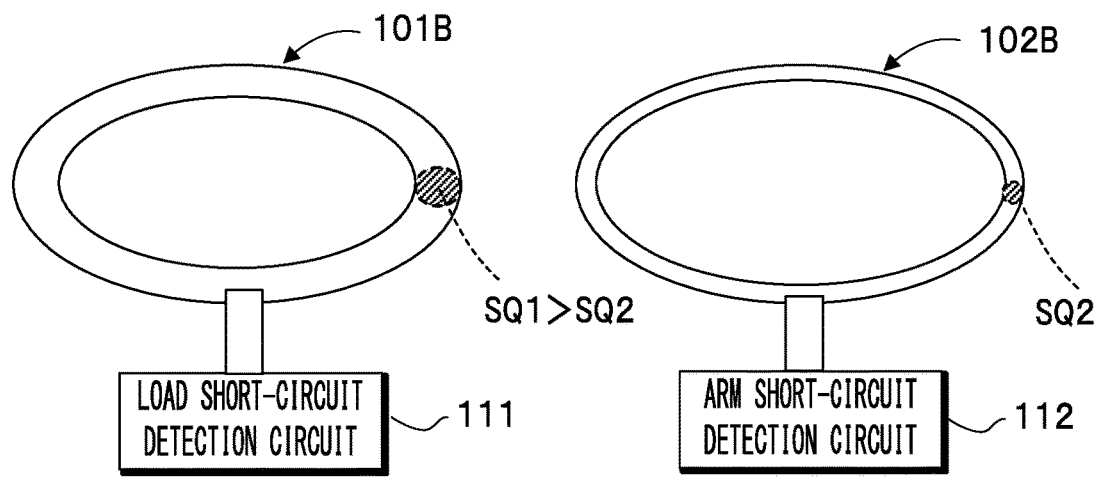
FIG. 5 is a diagram of a second specific example according to the first embodiment.

FIG. 5 is a diagram of a second specific example according to the first embodiment. In the second specific example, the cross-sectional area SQ2 of the second Rogowski coil 102B for detecting an arm short circuit differs from the cross-sectional area SQ1 of the first Rogowski coil 101B for detecting a load short circuit. Specifically, there is a relationship between the cross-sectional areas SQ1 and SQ2, which is defined by "SQ1>SQ2."

Solving Formula (5) for the cross-sectional area SQ, the following formula is obtained.

$$SQ=-(LG \cdot v)/(\mu \cdot n \cdot (di/(dt))). \quad (6)$$

According to Formula (6), in order to obtain a voltage v having a sufficient level from the Rogowski coil when the time gradient of the current di/dt is small, the cross-sectional area SQ needs to be increased.

In the second specific example, the time gradient di/dt of the current to be detected is small, and therefore, the cross-sectional area SQ1 of the first Rogowski coil 101B is greater than the cross-sectional area SQ2 of the second Rogowski coil 102B. Specifically, in Formula (6), the time gradient di/dt of the current during an arm short circuit is set to, for example, 10 times larger than that during a load short circuit, and thereby the cross-sectional areas SQ1 and SQ2 are calculated. The Rogowski coils 101B and 102B have the cross sectional areas SQ1 and SQ2 calculated by Formula (6), respectively, which enables both an arm short circuit and a load short circuit to be calculated with accuracy.

THIRD SPECIFIC EXAMPLE

Figure 6:
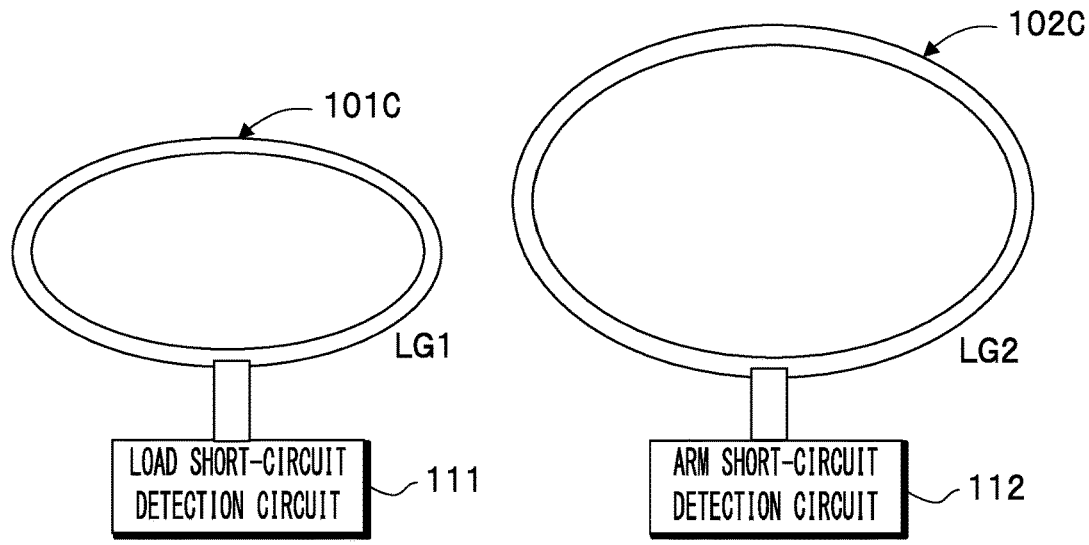
FIG. 6 is a diagram of a third specific example according to the first embodiment.

FIG. 6 is a diagram of a third specific example according to the first embodiment. In the third specific example, the magnetic path length LG2 of the second Rogowski coil 102C for detecting an arm short circuit differs from the magnetic path length LG1 of the first Rogowski coil 101C for detecting a load short circuit. Specifically, there is a relationship between the magnetic path lengths LG1 and LG2, which is defined by "LG1<LG2." The magnetic path length LG1 of the first Rogowski coil 101C is shorter than the magnetic path length LG2 of the second Rogowski coil 102C.

Solving Formula (5) for the magnetic path length LG, the following formula is obtained.

$$LG=-(\mu \cdot SQ \cdot n \cdot (di/(dt)))/v. \quad (7)$$

In the third specific example, in Formula (7), the time gradient of the current di/dt during an arm short circuit is set to, for example, 10 times larger than that during a load short circuit, and thereby the magnetic path lengths LG1 and LG2 are calculated. The Rogowski coils 101C and 102C have the magnetic path lengths LG1 and LG2 calculated by Formula (7), respectively, which enables both an arm short circuit and a load short circuit to be calculated with accuracy.

FOURTH SPECIFIC EXAMPLE

The fourth example relates to the implementation of the first Rogowski coil 101 and the second Rogowski coil 102.

Figure 7A:
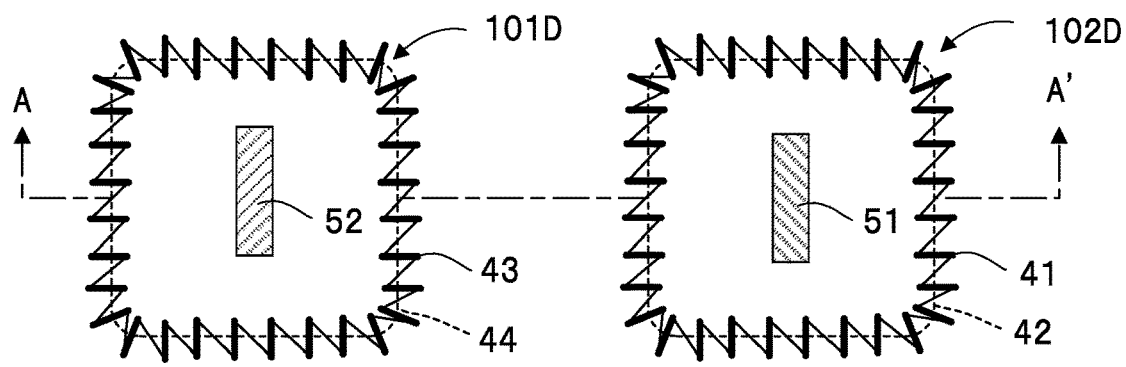
FIG. 7A is a diagram showing a fourth specific example of the first embodiment.
Figure 7B:
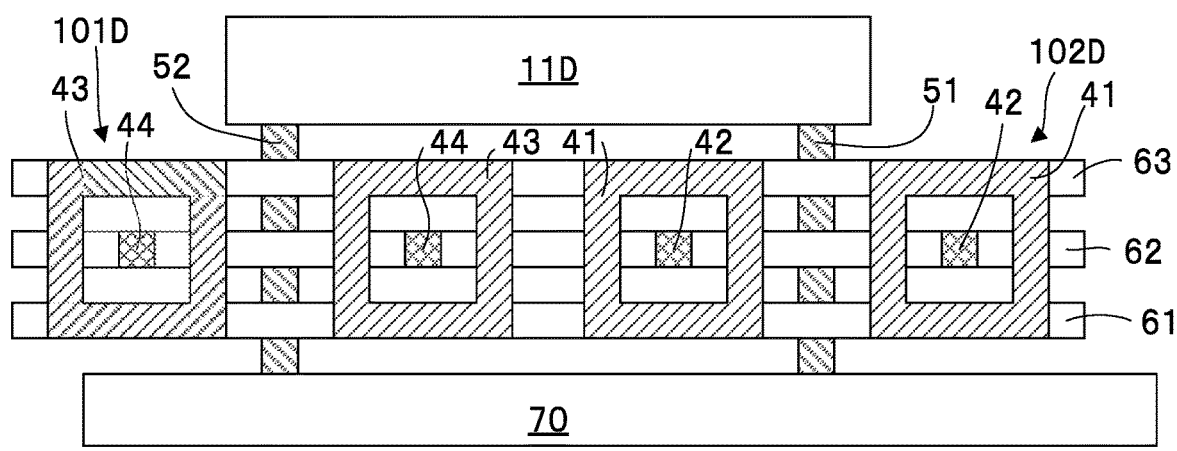
FIG. 7B is a diagram showing the fourth specific example of the first embodiment.

FIGS. 7A and 7B each are diagrams showing the fourth specific example of the first embodiment. Here, FIG. 7A is a diagram of the first Rogowski coil 101D and the second Rogowski coil 102D as seen from the semiconductor switch 11D shown in FIG. 7B. FIG. 7B is a cross-sectional view of A-A' line of FIG. 7A.

In FIG. 7B, a multilayer circuit board is disposed between the semiconductor switch 11D and a main circuit board 70. The multilayer circuit board includes a first layer circuit board 61, a second layer circuit board 62, and a third layer circuit board 63. The first layer circuit board 61 is separated from the main circuit board 70. The second layer circuit board 62 is separated from the first layer circuit board 61. The third layer circuit board 63 is separated from the second layer circuit board 62. The semiconductor switch 11D is separated from the third layer circuit board 63.

The conductors 51 and 52 correspond to the conductors 51 and 52 shown in FIG. 2, respectively. The conductor 51 is connected to the source of semiconductor switch 11D. The conductor 52 is connected to the drain of semiconductor switch 11D. The conductors 51 and 52 are connected to the main circuit board 70 through the third layer circuit board 63, the second layer circuit board 62 and the first layer circuit board 61. The semiconductor switch 11D is connected to another semiconductor switch of the power converter 1 or another power line via (i) the main circuit board 70 and (ii) the conductor 51 or 52.

The second Rogowski coil 102D for detecting an arm short circuit is disposed in the first layer circuit board 61, the second layer circuit board 62, and the third layer circuit board 63 such that the conductor 51 is surrounded by the second Rogowski coil 102D. The first Rogowski coil 101D for detecting a load short circuit is disposed in the first layer circuit board 61, the second layer circuit board 62, and the third layer circuit board 63 such that the conductor 52 is surrounded by the first Rogowski coil 101D.

Specifically, the second Rogowski coil 102D includes a first portion 41 and a second portion 42. The first portion 41 is a toroidally coiled part from one end of a conductor (a wiring) to a given point of the conductor. The second portion 42 is a part in which a portion from the given point of the conductor to the other end passes through the toroidal coil, and the other end returns to the end. The second portion 42 is disposed on the second layer circuit board 62. The first portion 41 includes (i) a wiring on the first layer circuit board 61, (ii) a wiring from the first layer circuit board 61 to the third layer circuit board 63 via through holes disposed in the second layer circuit board 62, and (iii) a wiring on the third layer circuit board 63. The first Rogowski coil 101D includes a first portion 43 that is similar to the first portion 41 of the second Rogowski coil 102D, and a second portion 44 that is similar to the second portion 42 of the second Rogowski coil 102D.

In the fourth specific example, both an arm short circuit and a load short circuit are detected with high accuracy. In the fourth specific example, unlike the configuration shown in FIG. 2, the second Rogowski coil 102D is disposed at a position corresponding to the source of the semiconductor switch 11D. The first Rogowski coil 101D is disposed at a position corresponding to the drain of the semiconductor switch 11D. In other words, in the fourth specific example, the second Rogowski coil 102D is disposed at the conductor 51 connected to the source of the semiconductor switch 11D, in the current route through an arm 10. Furthermore, the first Rogowski coil 101D is disposed on the conductor 52 connected to the drain of the semiconductor switch 11D. In other words, in the current route through the arm 10, the second Rogowski coil 102D, the semiconductor switch 11D, and the first Rogowski coil 101D are disposed in the listed order. This allows the two Rogowski coils to be disposed under the arm, as shown in FIG. 7B. In the fourth specific example, the wiring length between the two semiconductor switches 11D connected in series to each other, as well as the wiring length of the capacitor 30 (see FIG. 1) can be shortened.

FIFTH SPECIFIC EXAMPLE

Figure 8:
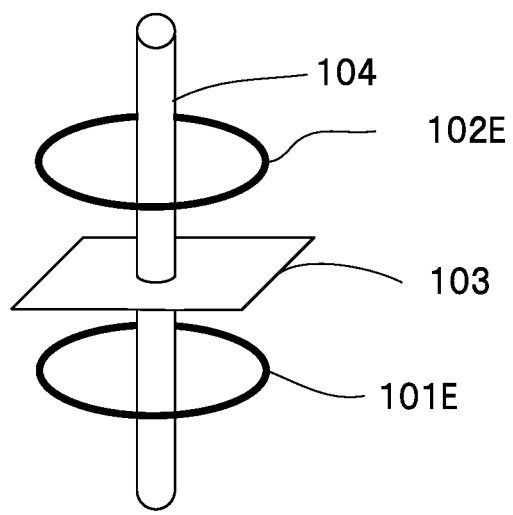
FIG. 8 is a diagram showing a fifth specific example of the first embodiment.

FIG. 8 is a diagram showing the fifth specific example of the first embodiment. In the fifth specific example, there are disposed a second Rogowski coil 102E for detecting an arm short circuit and a first Rogowski coil 101E for detecting a load short circuit, and a bus bar 104 is surrounded by them. The bus bar 104 is an example of a current route to be measured. In the fifth specific example, a shield plate 103 is disposed between the first Rogowski coil 101E and the second Rogowski coil 102E. In one example, the shield plate 103 is made of metal.

According to the fifth specific example, interference between two different currents is avoided, in one of which a current flows through the second Rogowski coil 102E, and in the other of which a current flows through the first Rogowski coil 101E.

Modifications of First Embodiment

The first embodiment can be modified as described below.

(1) In the first embodiment, the short circuit detector is applied to a two-phase inverter with four arms. However, the scope of application of the short circuit detector is not limited thereto. The short circuit detector can be applied to an inverter with a number of phases other than two, for example, a three-phase inverter. The short circuit detector may be applied to a power converter other than an inverter, such as a DC/DC converter.

(2) In the first embodiment, MOSFETs are used as an example of semiconductor switches. However, the semiconductor switches are not limited thereto, and they may be other types of semiconductor switches, such as Insulated Gate Bipolar Transistors (IGBTs).

(3) Any two, three, four, or all of the first to the fifth specific examples may be combined. For example, the number of turns of the first Rogowski coil 101 may be greater than that of the second Rogowski coil 102. In addition, the cross-sectional area of the first Rogowski coil 101 may be larger than that of the second Rogowski coil 102. Furthermore, the magnetic path length of the first Rogowski coil 101 may be shorter than that of the second Rogowski coil 102.

(4) In the fourth specific example, both the second Rogowski coil 102D and the first Rogowski coil 101D are disposed in the first layer circuit board 61, the second layer circuit board 62 and the third layer circuit board 63. However, at least one of the first Rogowski coil 101D and the second Rogowski coil 102D may be disposed in a circuit board (the first layer circuit board 61, the second layer circuit board 62 and the third layer circuit board 63). In the fourth specific example, the second Rogowski coil 102D, semiconductor switch 11D, and the first Rogowski coil 101D are disposed in the listed order, in the current route through an arm 10. However, alternatively, the first Rogowski coil 101D, the semiconductor switch 11D and the second Rogowski coil 102D may be disposed in the listed order, in the current route through the arm 10. In other words, the semiconductor switch 11D and the first Rogowski coil 101D may be disposed in the listed order, or in the reverse order.

(5) In the first embodiment, the arm short-circuit detection circuit 112, the load short-circuit detection circuit 111, and the short-circuit detection circuit 120 are separate, but these circuits may be one circuit.

(6) In the first embodiment, the gate drive circuit 20 receives a short-circuit detection signal E, but the gate drive circuit 20 may receive short-circuit detection signals E1 and E2. Protection operation may be changed in accordance with a short-circuit detection signal, as follows:

(i) When a short-circuit detection signal E2 is output, an arm short circuit has occurred. Accordingly, restart of the gate drive circuit 20 may be prohibited after the gate drive circuit 20 is stopped.

(ii) When a short-circuit detection signal E1 is output, a load short circuit has occurred. Accordingly, if the load short circuit is removed after the gate drive circuit 20 is stopped, the gate drive circuit 20 may be restarted.

2. Second Embodiment

Figure 9:
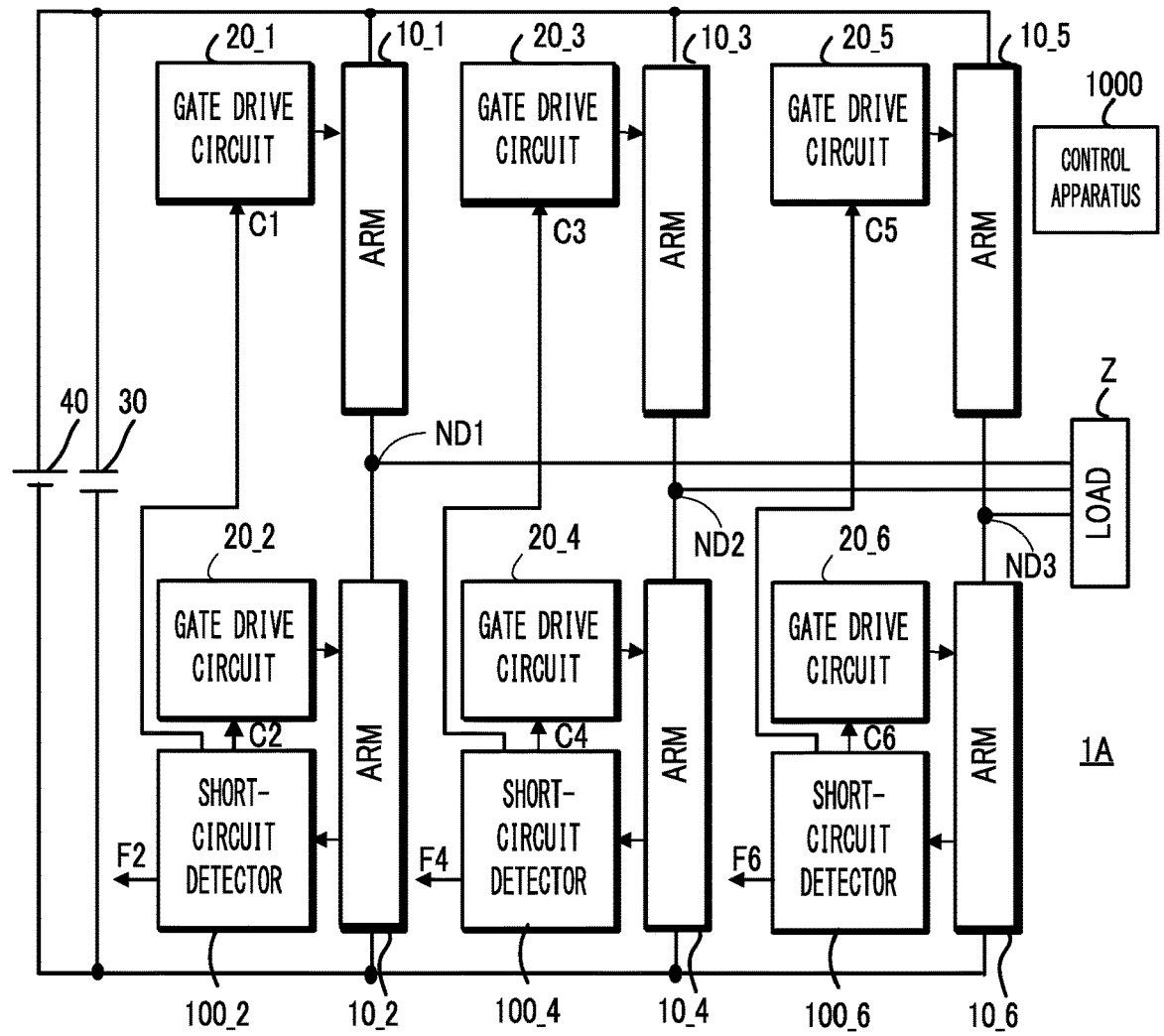
FIG. 9 is a circuit diagram of a power converter according to a second embodiment.

The second embodiment will be described with reference to the drawings. FIG. 9 is a circuit diagram of a power converter 1A according to the second embodiment. In the power converter 1A, the capacitor 30 is charged by the DC power supply 40 to stabilize the DC voltage. Arms 10_1 and 10_2 are connected in series to each other, and they are disposed between the two terminals of the capacitor 30. In addition, arms 10_3 and 10_4 are connected in series to each other, and they are disposed between the terminals. Furthermore, arms 10_5 and 10_6 are connected in series to each other, and they are disposed between the two terminals. There is a common connection node ND1 between arms 10_1 and 10_2. There is a common connection node ND2 between arms 10_3 and 10_4. There is a common connection node ND3 between arms 10_5 and 10_6. The nodes ND1, ND2, and ND3 are connected to a load Z (e.g., a motor winding). Each of the arms 10_1 to 10_6 includes a semiconductor switch. Gate drive circuits 20_1 to 20_6 correspond to arms 10_1 to 10_6, respectively. Each of the gate drive circuits 20_1 to 20_6 supplies a gate signal to the gate of a corresponding semiconductor switch to drive the semiconductor switch. In this way, the power converter 11A includes two or more arms 10_1 to 10_6, each of which includes a semiconductor switch, and supplies power from the DC power supply 40 to the load Z through the arms.

Attention will be focused on the arm 10_2 and description will be given of an arm short circuit. To avoid a short circuit in the power supply, two semiconductor switches 11_1 and 11_2 connected in series to each other are controlled such that they do not turn on at the same time. In this regard, description is the same as that in the first embodiment. An example will be described of a case in which the semiconductor switch 11_1 is set to OFF, and the semiconductor switch 11_2 is set to ON. If the semiconductor switch of the arm 10_2 is turned on while a short circuit occurs in the arm 10_1, an arm short-circuit current flows through the semiconductor switch of the arm 10_2 due to an unintended short circuit in the semiconductor switch 11_1. Even if there is no short circuit in the arm 10_1, the semiconductor switch of the arm 10_2 is turned on due to a malfunction of the semiconductor switch of the arm 10_1. If a short circuit occurs in the load Z in the power converter 1A, a load short-circuit current flows in the arm 10_2.

If such an arm short-circuit current or a load short-circuit current flows through the arm 10_2 for a long time, the normal semiconductor switch of the arm 10_2 may be damaged. Thus, there is provided a short circuit detector 100_2 that corresponds to the arm 10_2. Similar arm short-circuit current and load short-circuit current may flow through the other arms 10_1, and 10_3 to 10_6. Thus, in this embodiment, the power converter 1A includes a plurality of Q short circuit detectors that correspond to respective ones of a plurality of Q arms from among a plurality of P arms. "P" is a positive integer of 2 or more (e.g., P=6). "Q" is a positive integer that is less than P (e.g., Q=3). In other words, there is provided one short-circuit detector for each of some of the six arms 10_1 to 10_6. In the example of FIG. 9, there are provided short-circuit detectors 100_2, 100_4, and 100_6 for respective arms 10_2, 10_4, and 10_6. The arms 10_2, 10_4 and 10_6 are half of all arms (i.e., Q=P/2).

In the following description, as long as there is no need to distinguish between each of the arms 10_1 to 10_6, each is collectively referred to as arm 10. Similarly, each of the gate drive circuits 20_1 to 20_6 is collectively referred to as gate drive circuit 20. Each of the short-circuit detectors 100_2, 100_4, and 100_6 is collectively referred to as short-circuit detector 100.

In this embodiment, the reason for provision of the short-circuit detectors 100_2, 100_4, and 100_6 for the respective arms 10_2, 10_4, and 10_6 is as follows:

There are three patterns of current routes through which arm short-circuit currents flows.

(1) Current route R12 passing through arms 10_1 and 10_2:

When a short circuit occurs in either of arm 10_1 or 10_2, an arm short-circuit current flows through the current route R12.

(2) Current route R34 passing through arms 10_3 and 10_4:

When a short circuit occurs in either of arm 10_3 or 10_4, an arm short circuit current flows through the current route R34.

(3) Current route R56 passing through arms 10_5 and 10_6:

When a short circuit occurs in either of arm 10_5 or 10_6, an arm short circuit current flows through the current route R56.

In order to detect arm short-circuit currents flowing in all current routes, there must be provided short-circuit detectors 100 for the following arms (i) to (iii):
(i) either of the arm 10_1 or 10_2,
(ii) either of the arm 10_3 or 10_4, and
(iii) either of the arm 10_5 or 10_6.
This is condition 1.

There are six patterns of current routes through which load short-circuit currents flows.

(1) Current route R14 passing through arms 10_1 and 10_4:

When a short circuit occurs in a section from the arms 10_1 to 10_4 passing through the load Z, a load short-circuit current flows in the current route R14.

(2) Current route R32 passing through arms 10_3 and 10_2:

When a short circuit occurs in a section from the arms 10_3 to 10_2 passing through the load Z, a load short-circuit current flows in the current route R32.

(3) Current route R36 passing through arms 10_3 and 10_6:

When a short circuit occurs in a section from the arms 10_3 to 10_6 passing through the load Z, a load short-circuit current flows in the current route R36.

(4) Current route R54 passing through arms 10_5 and 10_4:

When a short circuit occurs in a section from the arms 10_5 to 10_4 passing through the load Z, a load short-circuit current flows in the current route R54.

(5) Current route R52 passing through arms 10_5 and 10_2:

When a short circuit occurs in a section from the arms 10_5 to 10_2 passing through the load Z, a load short-circuit current flows in the current route R52.

(6) Current route R16 passing through arms 10_1 and 10_6

When a short circuit occurs in a section from the arms 10_1 to 10_6 passing through the load Z, a load short-circuit current flows in the current route R16.

In order to detect load short-circuit currents passing in all current routes, there must be provided short-circuit detectors 100 for the following arms (i) to (vi):
(i) either of the arm 10_1 or 10_4,
(ii) either of the arm 10_3 or 10_2,
(iii) either of the arm 10_3 or 10_6,
(iv) either of the arm 10_5 or 10_4,
(v) either of the arm 10_5 or 10_2, and
(vi) either of the arm 10_1 or 10_6.
This is condition 2.

There are two approaches to satisfy both conditions 1 and 2. The first approach is to provide short circuit detectors 100 for the arms 10_1, 10_3 and 10_5. The second approach is to provide short circuit detectors 100 for the arms 10_2, 10_4, and 10_6. In this embodiment, the second approach is used to detect an arm short-circuit current and a load short-circuit current for all current routes.

Figure 10:
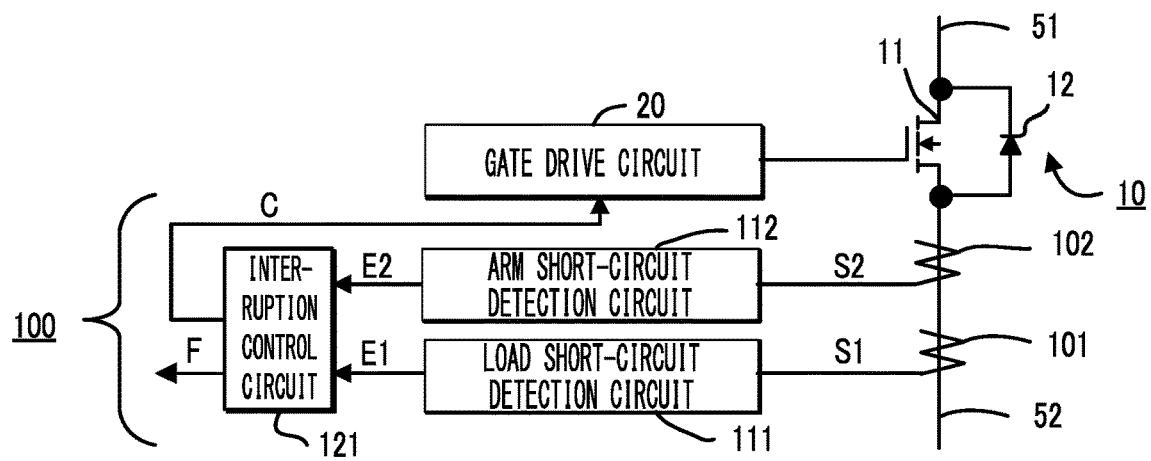
FIG. 10 is a circuit diagram showing an example of a configuration of each short-circuit detector according to the second embodiment.

FIG. 10 is a circuit diagram showing an example of the configuration of each short-circuit detector 100 according to the second embodiment. In FIG. 10, an arm 10 and a gate drive circuit 20 are shown together with a short-circuit detector 100 to clarify description of the short-circuit detector 100.

In FIG. 10, each arm 10 includes a semiconductor switch 11 and a flywheel diode 12 connected in reverse parallel to the semiconductor switch 11. Since the semiconductor switch 11 and the gate drive circuit 20 are the same as those of the first embodiment, detailed description thereof is omitted.

In the example shown in FIG. 10, a conductor 52 is inserted into the first Rogowski coil 101 and the second Rogowski coil 102. Since the first Rogowski coil 101 and the second Rogowski coil 102 are the same as those of the first embodiment, detailed description thereof is omitted.

The arm short-circuit detection circuit 112 detects an arm short circuit in the power converter 1A based on a second detection signal S2. Since the arm short-circuit detection circuit 112 is the same as that of the first embodiment, detailed description thereof is omitted.

The load short-circuit detection circuit 111 detects a load short circuit in the power converter 1A based on a first detection signal S1. Since the load short-circuit detection circuit 111 is the same as that of the first embodiment, detailed description thereof is omitted.

An interruption control circuit 121 detects whether any short circuit has occurred in the power converter 1A, based on the short-circuit detection signal E1 output by the load short-circuit detection circuit 111 and the short-circuit detection signal E2 output by the arm short-circuit detection circuit 112. In this case, the interruption control circuit 121 generates a short-circuit detection signal E. In this example, the interruption control circuit 121 includes an OR circuit. The OR circuit generates, as a short-circuit detection signal E, the short-circuit detection signal E1 and the short-circuit detection signal E2.

The interruption control circuit 121 performs control to interrupt an arm short-circuit current or a load short-circuit current in response to generating the short-circuit detection signal E. Specifically, the interruption control circuit 121 outputs an interruption signal C in response to generating the short-circuit detection signal E2. The interruption signal C is one for stopping driving the following (i) and (ii):
(i) a semiconductor switch 11 of an arm 10 (e.g., 10_2) for which a short-circuit detector 100 is provided, and
(ii) a semiconductor switch 11 of an arm 10 (e.g., 10_1) for which a short-circuit detector 100 is not provided.

Specifically, a case will be explained in which an arm short circuit has occurred (the short-circuit detection signal E2 is generated) in the short-circuit detector 100_2 shown in FIG. 9. In this case, the interruption control circuit 121 of the short-circuit detector 100_2 outputs an interruption signal C2 to the gate drive circuit 20_2 of the arm 10_2 in which an arm short-circuit current is detected. Furthermore, the interruption control circuit 121 outputs an interruption signal C1 to the gate drive circuit 20_1 of the arm 10_1.

When the short-circuit detection signal E1 is generated, the interruption control circuit 121 outputs, to the gate drive circuit 20 of the arm 10 in which a load short-circuit current is detected, an interruption signal C for stopping driving of the semiconductor switch 11 of the arm 10.

When the short-circuit detection signal E is generated, the interruption control circuit 121 outputs a fault signal F to a control apparatus 1000. The control apparatus 1000 receives the fault signal F, and starts control to stop the power converter 1A.

Figure 11A:
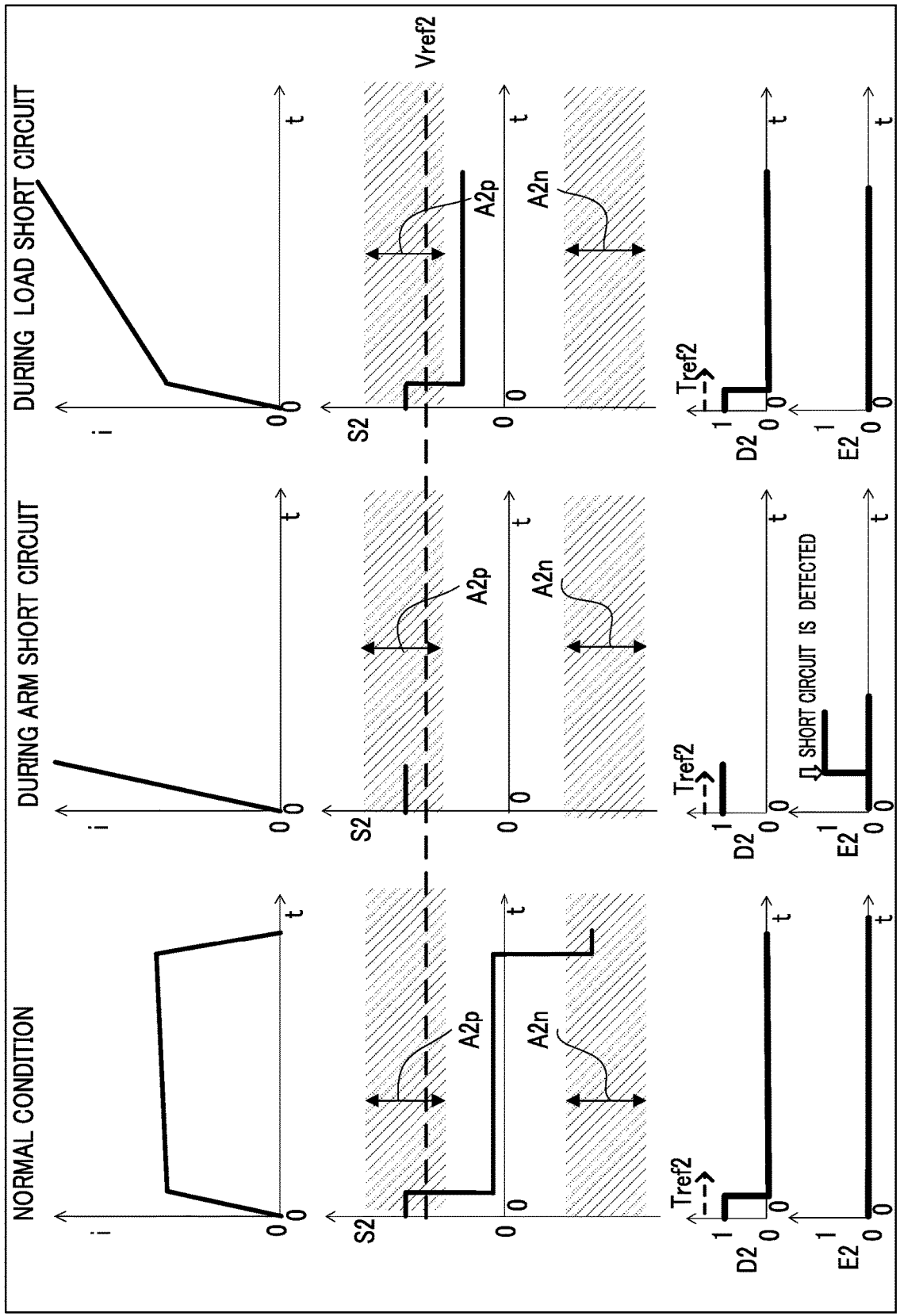
FIG. 11A is a waveform diagram showing an example operation according to the second embodiment.
Figure 11B:
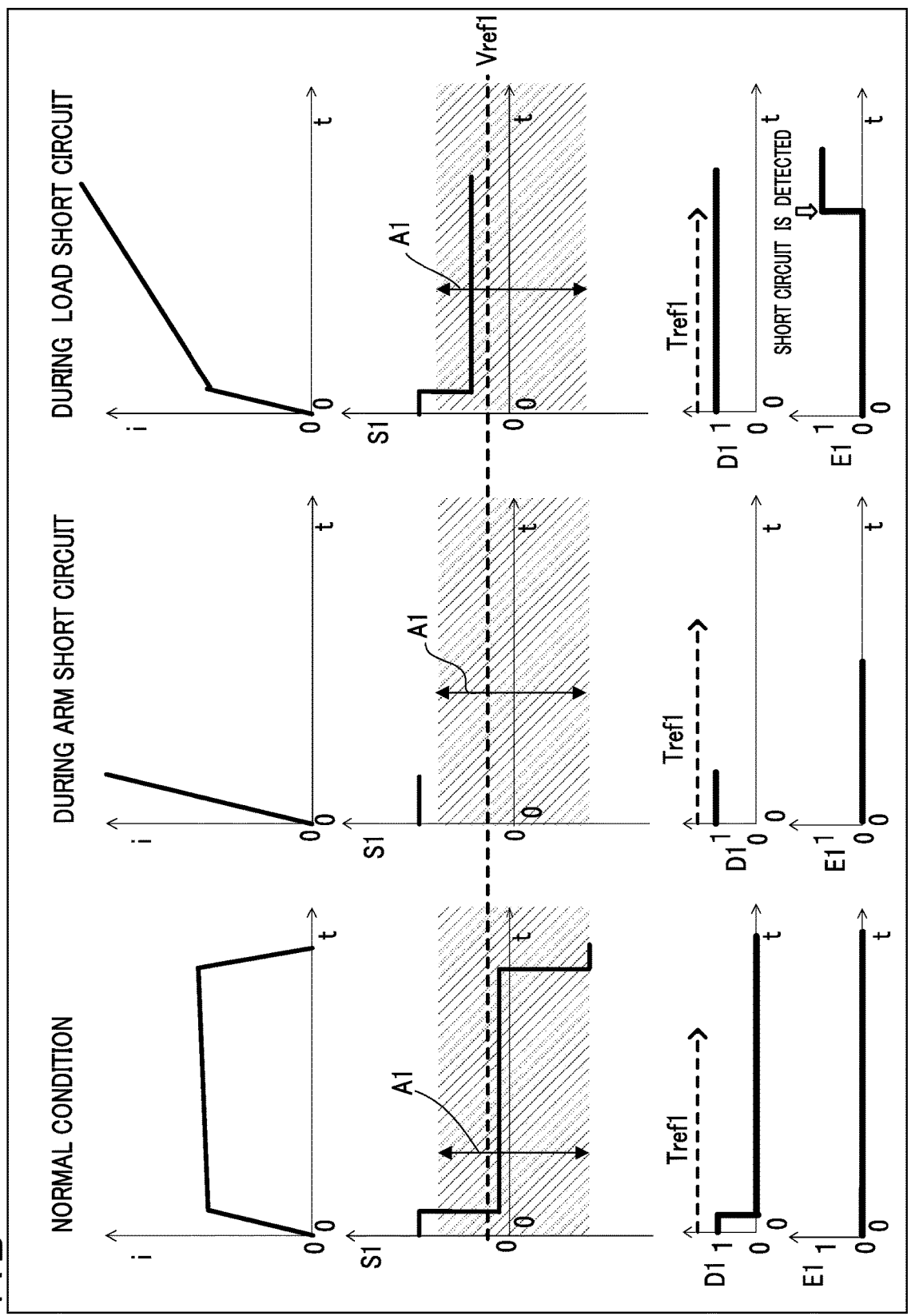
FIG. 11B is a waveform diagram showing an example operation according to the second embodiment.
Figure 11C:
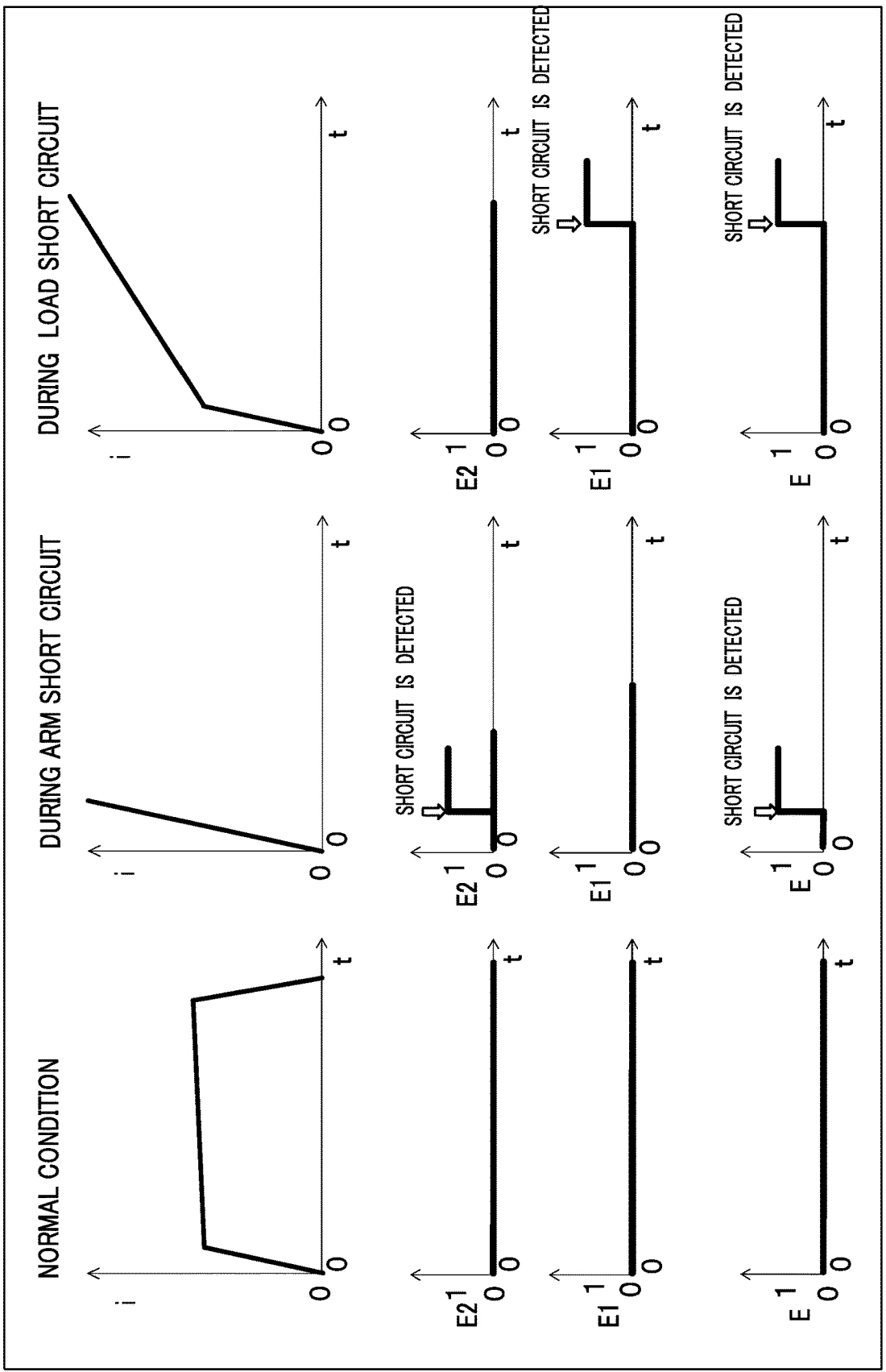
FIG. 11C is a waveform diagram showing an example operation according to the second embodiment.

FIGS. 11A, 11B, and 11C each show waveform diagrams of example operations according to the second embodiment.

FIG. 11A shows, as to each of (a) during a normal condition, (b) during an arm short circuit, and (c) during a load short circuit, shown are (1) a waveform of a current i flowing through the conductor 52, (2) a waveform of the second detection signal S2, (3) a waveform of a level determination signal D2 generated in the arm short-circuit detection circuit 112, and (4) a waveform of the short-circuit detection signal E2 output by the arm short-circuit detection circuit 112.

In FIG. 11B, as to each of (a) during a normal condition, (b) during an arm short circuit, and (c) during a load short circuit, shown are (1) a waveform of a current i flowing through the conductor 52, (2) a waveform of the first detection signal S1, (3) a waveform of a level determination signal D1 generated in the load short-circuit detection circuit 111, and (4) a waveform of the short-circuit detection signal E1 output by the load short-circuit detection circuit 111.

In FIG. 11C, as to each of (a) during a normal condition, (b) during an arm short circuit, and (c) during a load short circuit, shown are (1) a waveform of a current i flowing through the conductor 52, (2) a waveform of the short-circuit detection signal E2 output by the arm short-circuit detection circuit 112, (3) a waveform of the short-circuit detection signal E1 output by the load short-circuit detection circuit 111, and (4) a waveform of the short-circuit detection signal E output by the interruption control circuit 121.

In these drawings, the horizontal axis represents time t, and the vertical axis represents a voltage, a current, and a truth value.

First, description will be given of the operation of the arm short-circuit detection circuit 112 with reference FIG. 11A. The arm short-circuit detection circuit 112 compares the second detection signal S2 output from the second Rogowski coil 102 with the second reference level Vref2. When the second detection signal S2 exceeds the second reference level Vref2, the arm short-circuit detection circuit 112 sets the level determination signal D2 to the active level "1."

In this regard, description is the same as that in the first embodiment. Furthermore, the arm short-circuit detection circuit 112 sets the short-circuit detection signal E2 to the active level "1," when the level determination signal D2 is maintained at the active level "1" beyond the second reference time Tref2. In this regard, description is the same as that in the first embodiment.

During a normal condition, the current i flowing through the conductor 52 rises by turning on the semiconductor switch 11. In the rising period of the current i, the second detection signal S2, which represents the time gradient di/dt of the current i, exceeds the second reference level Vref2, and the level determination signal D2 is maintained at the active level "1." In this regard, description is the same as that in the first embodiment. For the same reason described in the first embodiment, the short-circuit detection signal E2 never changes to the active level "1."

During a load short circuit, the current i flowing through the conductor 52 rises by turning on the semiconductor switch 11. Thereafter, the current i increases with a time gradient, which is determined by the self-inductance existing in the route of the load short-circuit current. In this regard, description is the same as that in the first embodiment. For the same reason described in the first embodiment, the short-circuit detection signal E2 never changes to the active level "1."

The operation of the arm short-circuit detection circuit 112 during an arm short circuit is the same as that in the first embodiment. The level determination signal D2 is maintained at the active level "1" beyond the second reference time Tref2. For the same reason described in the first embodiment, the short-circuit detection signal E2 changes to the active level "1."

In this example, the second Rogowski coil 102 detects, with high accuracy, the time gradient di/dt of the current in which the second detection signal S2 falls within the range A2p or A2n. The second reference level Vref2 is within the range A2p. Accordingly, the arm short-circuit detection circuit 112 can detect an arm short circuit with high accuracy.

Next, description will be given of the operation of the load short-circuit detection circuit 111 with reference to FIG. 11B. The load short-circuit detection circuit 111 compares the first detection signal S1 output from the first Rogowski coil 101 with the first reference level Vref1. When the first detection signal S1 exceeds the first reference level Vref1, the load short-circuit detection circuit 111 sets the level determination signal D1 to the active level "1."

In this regard, description is the same as that in the first embodiment.

Furthermore, the load short-circuit detection circuit 111 sets the short-circuit detection signal E1 to the active level "1," when the level determination signal D1 is maintained at the active level "1" beyond the first reference time Tref1. In this regard, description is also the same as that in the first embodiment.

During the normal condition, a current i flowing through the conductor 52 rises due to the turning on of the semiconductor switch 11. Thereafter, in the rising period of the current i, the first detection signal S1, which represents the time gradient di/dt of the current i, exceeds the first reference level Vref1, and the level determination signal D1 changes to the active level "1." In this regard, description is the same as that in the first embodiment. For the same reason described in the first embodiment, the short-circuit detection signal E1 never changes to the active level "1."

When a semiconductor switch connected in series to the semiconductor switch 11 has a short circuit failure, and the semiconductor switch 11 is turned on, an arm short circuit will occur. In this case, for the same reason described in the first embodiment, the first detection signal S1 exceeds the first reference level Vref1, and the level determination signal D1 changes to the active level "1."

However, during the arm short circuit, the second detection signal S2 exceeds the second reference level Vref2, and the level determination signal D2 changes to the active level "1."

For the same reason described in the first embodiment a load short circuit resulting from an arm short circuit is never detected.

During a load short circuit, in the period of time during which the current i increases with a constant time gradient immediately after the rise of the current i, the first detection signal S1 exceeds the first reference level Vref1, and the level determination signal D1 changes to the active level "1." In this regard, description is the same as that in the first embodiment. For the same reason described in the first embodiment, the short-circuit detection signal E1 changes to the active level "1."

In this example, the first Rogowski coil 101 detects, with high accuracy, the current time gradient di/dt in which the first detection signal S1 falls within the range A1. The first reference level Vref1 is within the range A1. Accordingly, the first detection signal S1 generated by a load short circuit can be detected with high accuracy.

Next, description will be given of the operation of the interruption control circuit 121 with reference to FIG. 11C. As shown in FIG. 11C, the interruption control circuit 121 outputs, as the short-circuit detection signal E, the logical sum of the short-circuit detection signal E1 and the short-circuit detection signal E2. Accordingly, during an arm short circuit or a load short circuit, the short-circuit detection signal E is output to the gate drive circuit 20. As a result, driving of the semiconductor switch 11 is stopped by the gate drive circuit 20.

Figure 12:
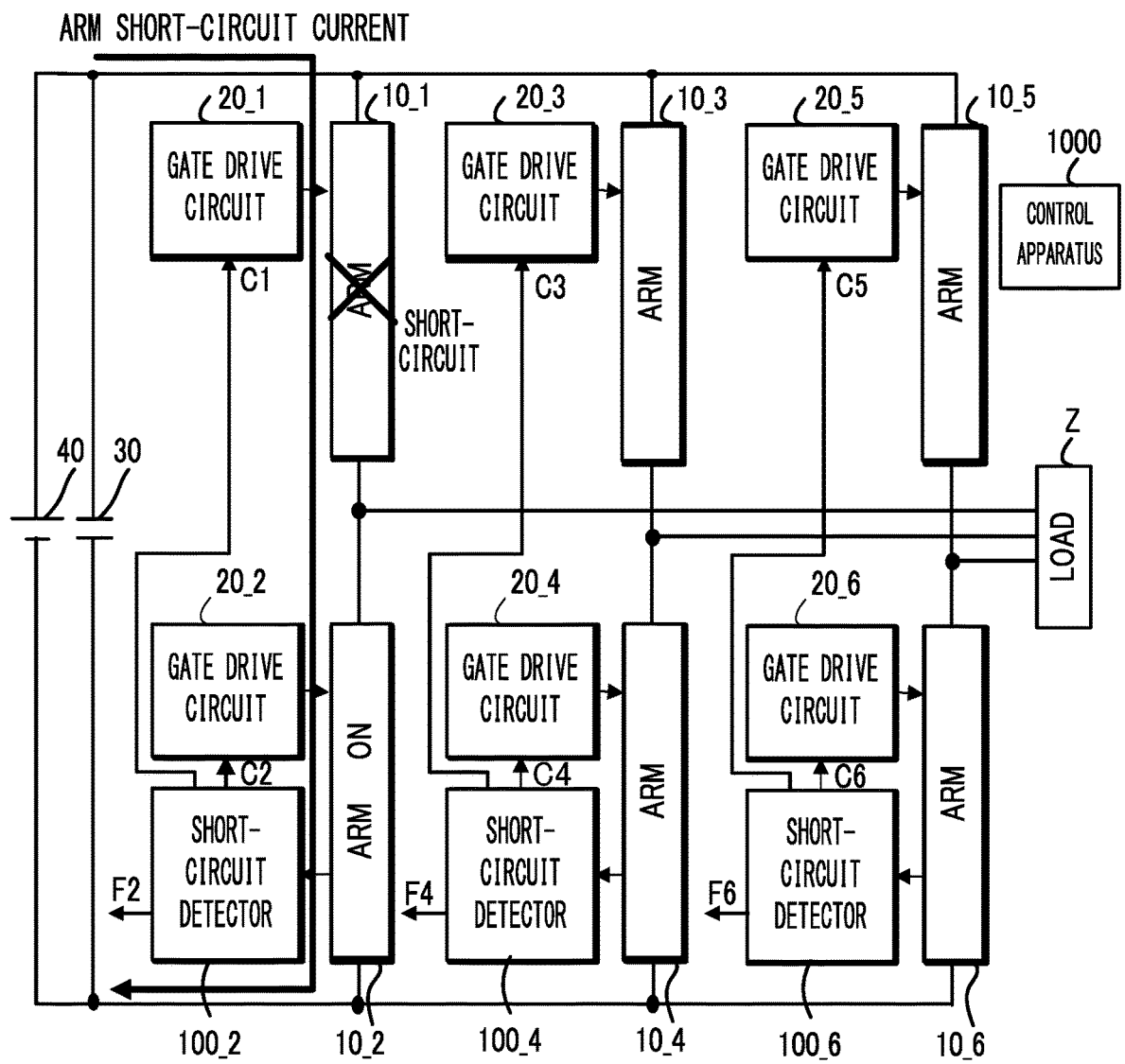
FIG. 12 is a circuit diagram of a first operation example according to the second embodiment.

Next, description will be given of an overall operation example according to the second embodiment. FIG. 12 is a circuit diagram of a first operation example according to the second embodiment. In the first operation example, a short circuit has occurred in the arm 10_1. The "X (cross)" mark shown in FIG. 12 represents a short circuit. This is also the case in FIGS. 13 and 14. In one example, this short circuit is a failure of the semiconductor switch 11 of the arm 10_1. In one example, this short circuit may occur when the semiconductor switch 11 is turned on due to a malfunction resulting from noise or other factors. In the first operation example, the arm short-circuit current due to the short circuit in the arm 10_1 flows through the arm 10_2 that is in the ON state.

In the short circuit detector 100_2 that corresponds to the arm 10_2, the arm short-circuit detection circuit 112 generates a short-circuit detection signal E2. The interruption control circuit 121 outputs an interruption signal C2 to the gate drive circuit 20_2 of the arm 10_2. Furthermore, the interruption control circuit 121 outputs an interruption signal C1 to the gate drive circuit 20_1 of the arm 10_1. As a result, the arm short-circuit current flowing through the current route through the arms 10_1 and 10_2 is interrupted. In the short circuit detector 100_2, the interruption control circuit 121 outputs a fault signal F2 to the control apparatus 1000. This causes the control apparatus 1000 to start a control to stop the power converter 1.

Figure 13:
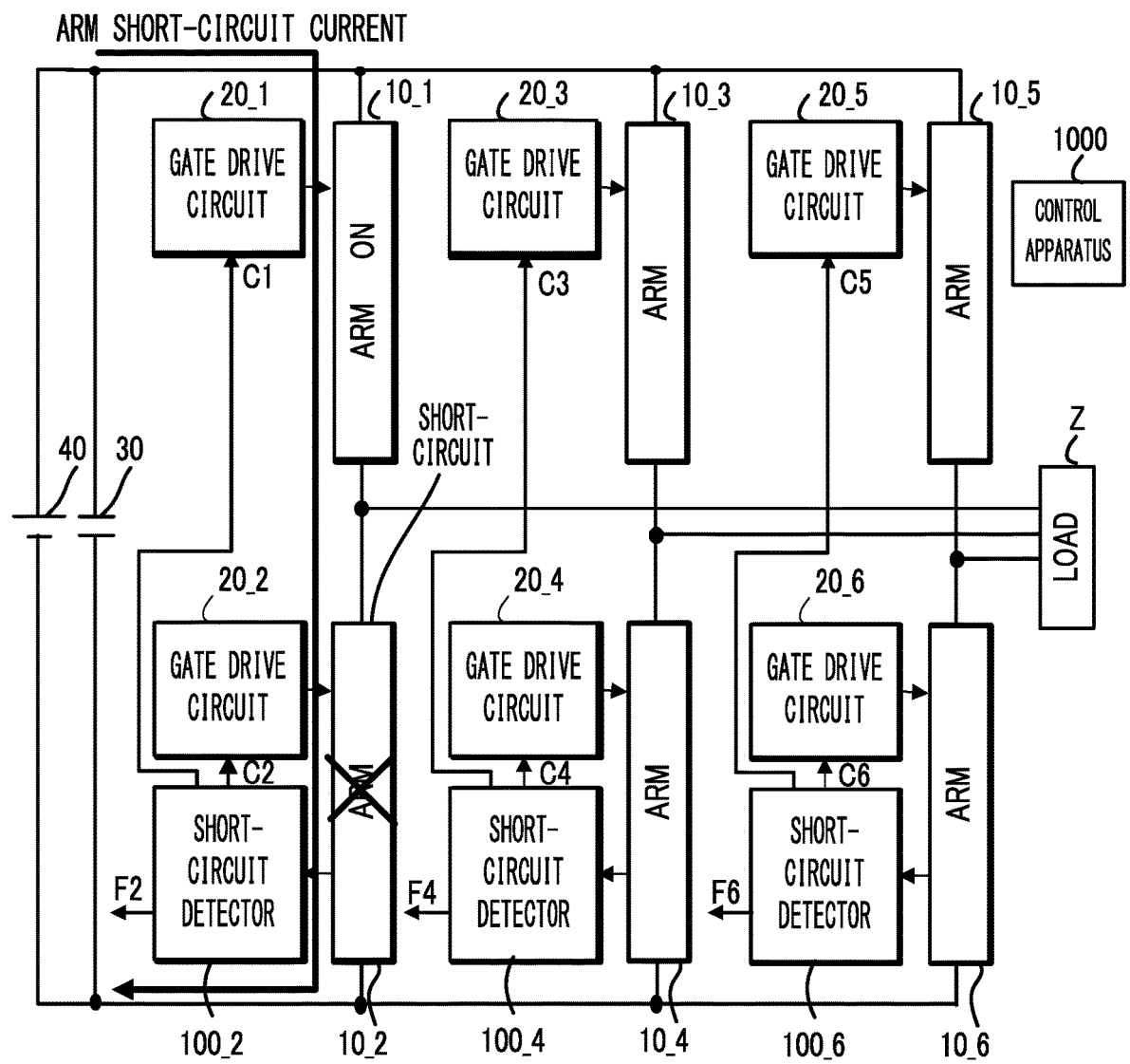
FIG. 13 is a circuit diagram of a second operation example according to the second embodiment.

FIG. 13 is a circuit diagram of a second operational example according to the second embodiment. In the second operation example, when the arm 10_1 is in the ON state, a short circuit occurs in the arm 10_2 connected to the arm 10_1. At this time, an arm short-circuit current flows through the arms 10_1 to 10_2.

In this case, in the short-circuit detector 100_2 that corresponds to the arm 10_2, the arm short-circuit detection circuit 112 generates a short-circuit detection signal E2. The interruption control circuit 121 outputs an interruption signal C2 to the gate drive circuit 20_2 of the arm 10_2. Furthermore, the interruption control circuit 121 outputs an interruption signal C1 to the gate drive circuit 20_1 of the arm 10_1. As a result, the arm 10_1 is changed from the ON state to the OFF state, and the arm short-circuit current flowing through the current route, which passes through the arms 10_1 and 10_2, is interrupted. In this case, in the short-circuit detector 100_2, the interruption control circuit 121 outputs a fault signal F2 to the control apparatus 1000.

Figure 14:
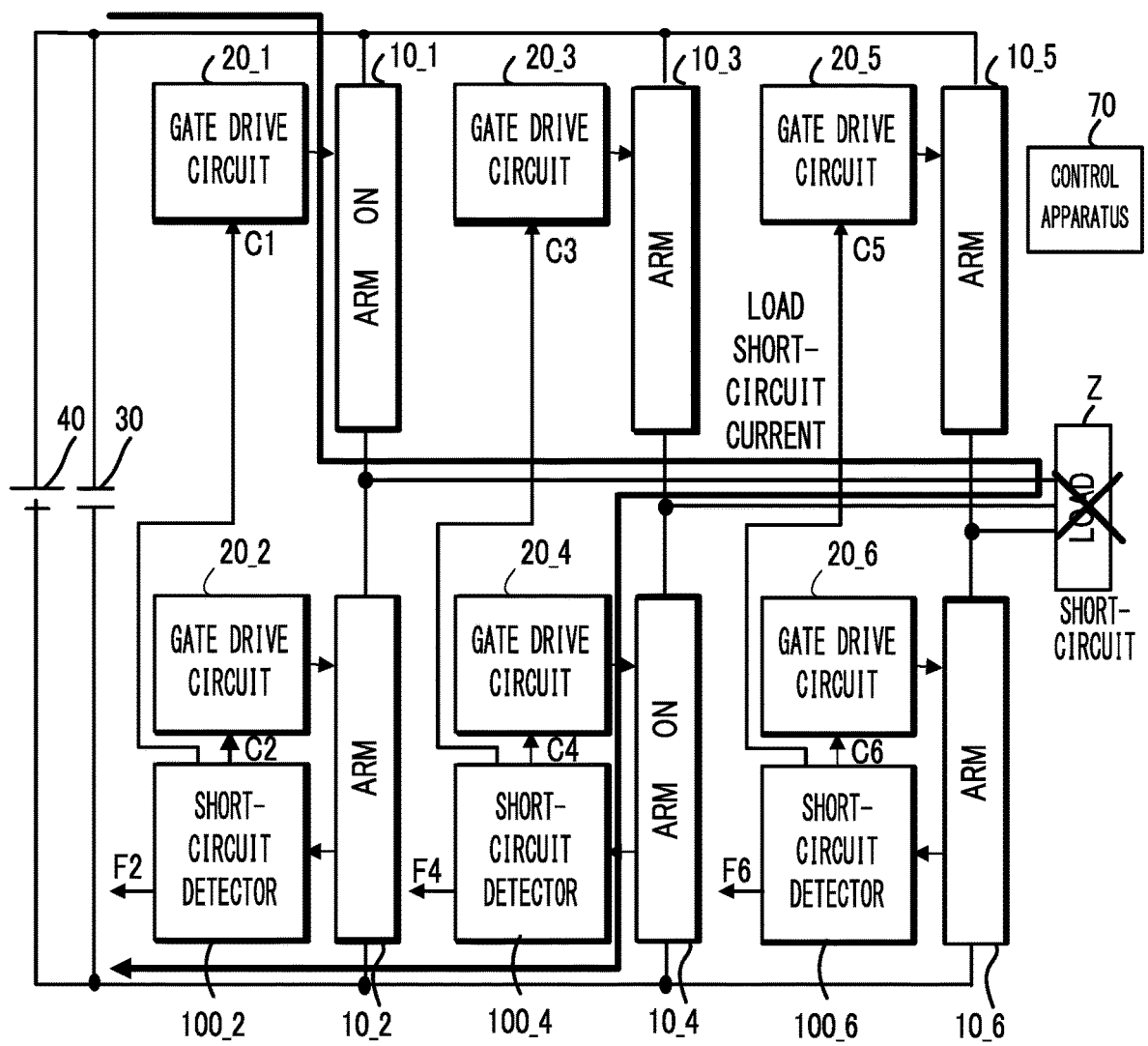
FIG. 14 is a circuit diagram of a third operation example according to the second embodiment.

FIG. 14 is a circuit diagram of a third operation example according to this embodiment. In the third operation example, a case will be explained in which a short circuit has occurred in a section from the arms 10_1 to 10_4 through the load Z. In this case, when the arms 10_1 and 10_4 are in the ON state, a load short-circuit current flows through the arms 10_1 and 10_4.

In the short-circuit detector 100_4 corresponding to the arm 10_4, the load short-circuit detection circuit 111 generates a short-circuit detection signal E1. Furthermore, the interruption control circuit 121 outputs an interruption signal C4 to the gate drive circuit 20_4 of the arm 10_4. As a result, the load short-circuit current that flows through the current route, which passes through the arms 10_1 and 10_4, is interrupted. Furthermore, in the short-circuit detector 100_4, the interruption control circuit 121 outputs a fault signal F2 to the control apparatus 1000.

As described above, the power converter 1A includes a plurality of Q short-circuit detectors (e.g., Q=3) (e.g., 100_2, 100_4, and 100_6) that correspond to respective ones of a plurality of Q arms (e.g., 10_2, 10_4, and 10_6) from among a plurality of P arms 10 (e.g., P=6). In other words, there are provided short-circuit detectors for only some among all the arms.

Each of six short-circuit detectors 100 includes a first Rogowski coil 101 that outputs a first detection signal S1 in accordance with a current that flows through a corresponding arm (e.g., 10_2) due to a short circuit in the load, and detects a short circuit based the first detection signal S1. In addition, each of the short-circuit detectors 100 includes a second Rogowski coil 102 that outputs a second detection signal S2 in accordance with a current that flows through the corresponding arm (e.g., 10_2) due to (i) a short circuit in the corresponding arm or (ii) another arm (e.g., 10_1) from among six arms 10, and detects a short circuit based on the second detection signal S2.

According to this embodiment, use of a Rogowski coil enables both an arm short circuit and a load short circuit that will occur in the power converter 1A to be detect accurately. Furthermore, according to this embodiment, no discrete components, such as a CT and the like, are used to detect a short circuit current, which reduces cost and avoids increasing size of the short circuit detector.

In this embodiment, each of the plurality of Q short-circuit detectors 100 includes an interruption control circuit 121. In response to detecting a short circuit, the interruption control circuit 121 stops driving (i) a semiconductor switch 11 of the corresponding arm (e.g., 10_2), and (ii) a semiconductor switch 11 of another arm (e.g., 10_1) for which none of the plurality of Q short-circuit detectors are provided. Accordingly, while protecting the semiconductor switches 11 of each of the arms 10 from short circuits, reduction in size and reduction in cost of the power converter 1A are achieved.

In this embodiment, two Rogowski coils are required. One of the two is the first Rogowski coil 101, which generates a first detection signal S1 having an appropriate level during a load short circuit. The other one is the second Rogowski coil 102, which generates a second detection signal S2 having an appropriate level during an arm short circuit. Description will be given of specific examples of the first Rogowski coil 101 and the second Rogowski coil 102 in the second embodiment.

FIRST SPECIFIC EXAMPLE

In the first embodiment, the number of turns n2 of the second Rogowski coil 102 for detecting an arm short circuit differs from the number of turns n1 of the first Rogowski coil 101 for detecting a load short circuit. In this regard, description is the same as that in the first specific example of the first embodiment. The effects obtained from this first specific example are the same as those of the first specific example of the first embodiment.

SECOND SPECIFIC EXAMPLE

In the second specific example, the cross-sectional area SQ1 of the first Rogowski coil 101 for detecting a load short circuit differs from the cross-sectional area SQ2 of the second Rogowski coil 102 for detecting an arm short circuit. In this regard, description is the same as that in the second specific example of the first embodiment. The effects obtained from this second specific example are the same as those of the second specific example of the first embodiment.

THIRD SPECIFIC EXAMPLE

In the third example, the magnetic path length LG1 of the first Rogowski coil 101 for detecting a load short circuit differs from the magnetic path length LG2 of the second Rogowski coil 102 for detecting an arm short circuit. In this regard, description is the same as that in the third specific example of the first embodiment. The effects obtained from this third specific example are the same as those of the third specific example of the first embodiment.

FOURTH SPECIFIC EXAMPLE

Figure 15A:
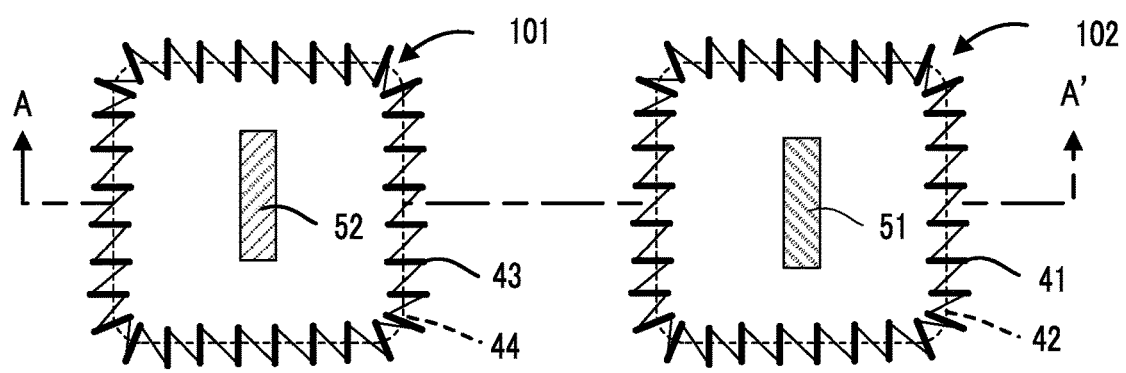
FIG. 15A is a circuit diagram according to the second embodiment.
Figure 15B:
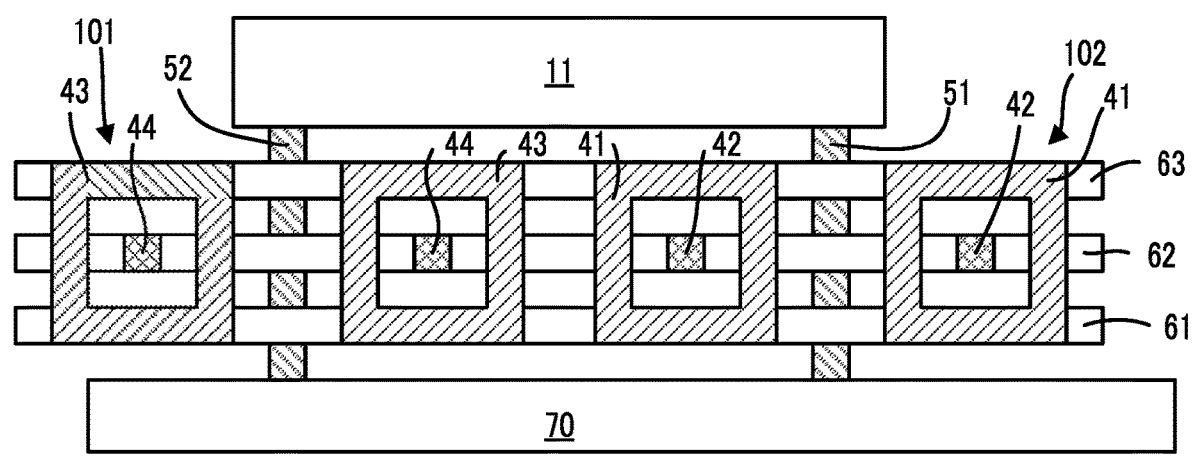
FIG. 15B is a circuit diagram according to the second embodiment.

The fourth example relates to the implementation of the first Rogowski coil 101 and the second Rogowski coil 102. FIGS. 15A and 15B are each a diagram according to the fourth specific example of the second embodiment. Here, FIG. 15A is a diagram of the first Rogowski coil 101 and the second Rogowski coil 102 as seen from the semiconductor switch 11 shown in FIG. 7B. FIG. 15B is a cross-sectional view along line A-A' in FIG. 15A.

In FIG. 15B, a multilayer circuit board is disposed between the semiconductor switch 11 and a main circuit board 70. The multilayer circuit board includes a first layer circuit board 61, a second layer circuit board 62, and a third layer circuit board 63. In this regard, description is the same as that in the fourth specific example of the first embodiment.

The conductors 51 and 52 correspond to the conductors 51 and 52 shown in FIG. 10, respectively. The conductor 51 is connected to the source of semiconductor switch 11. The conductor 52 is connected to the drain of semiconductor switch 11. In this regard, description is the same as that in the fourth specific example of the first embodiment.

The second Rogowski coil 102 for detecting an arm short circuit is disposed in the first layer circuit board 61, the second layer circuit board 62, and the third layer circuit board 63 such that the conductor 51 is surrounded by the second Rogowski coil 102. The first Rogowski coil 101 for detecting a load short circuit is disposed in the first layer circuit board 61, the second layer circuit board 62, and the third layer circuit board 63 such that the conductor 52 is surrounded by the first Rogowski coil 101. In this regard, description is the same as that in the fourth specific example of the first embodiment.

This fourth specific example has the same effects as the fourth specific example of the first embodiment. In other words, both an arm short circuit and a load short circuit are detected with high accuracy. Furthermore, in the current route through the arm 10, the second Rogowski coil 102D, the semiconductor switch 11D, and the first Rogowski coil 101D are disposed in the listed order. Accordingly, in the fourth example, the wiring length between the two semiconductor switches 11 connected in series to each other, as well as the wiring length of the capacitor 30 (see FIG. 9), can be shortened.

FIFTH SPECIFIC EXAMPLE

In the fifth Specific Example, the second Rogowski coil 102 for detecting an arm short circuit and the first Rogowski coil 101 for detecting a load short circuit are disposed such that they are surrounded by a bus bar. In this regard, description is the same as that in the fifth specific example of the first embodiment. The effects obtained from this fifth specific example are the same as those of the fifth specific example of the first embodiment.

Figure 16:
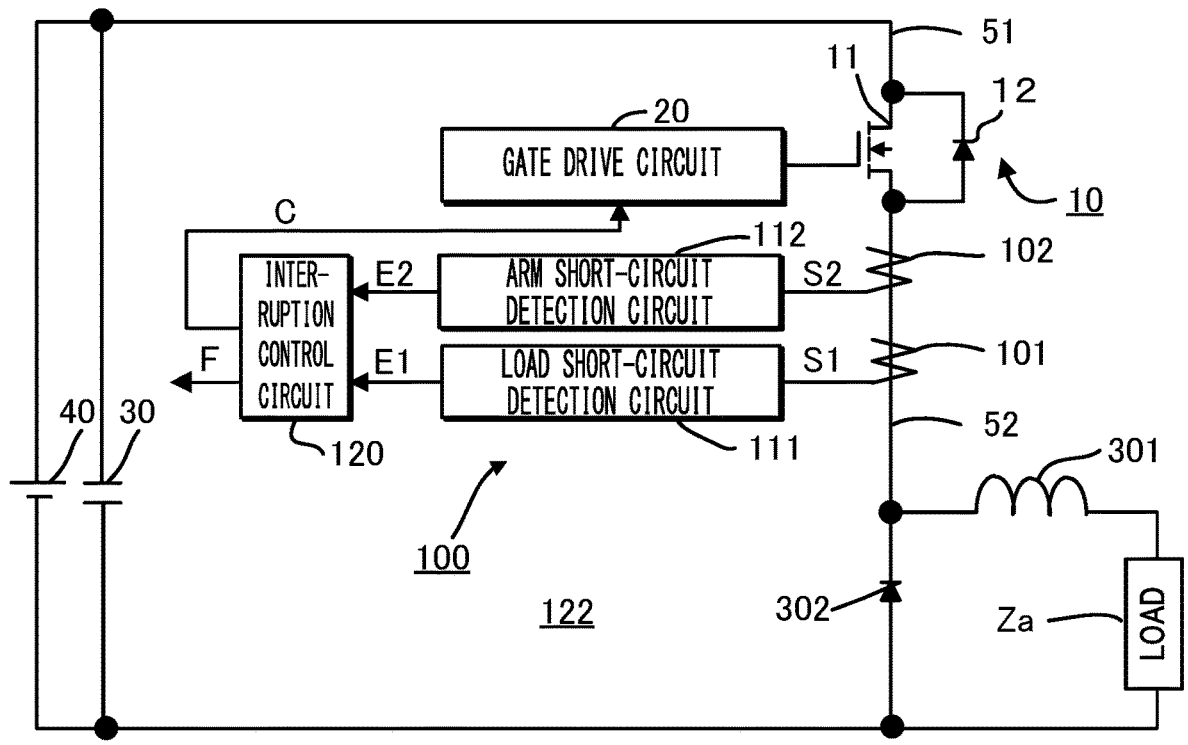
FIG. 16 is a circuit diagram showing an example of application of a short-circuit detector according to the second embodiment to another power converter.
Figure 17:
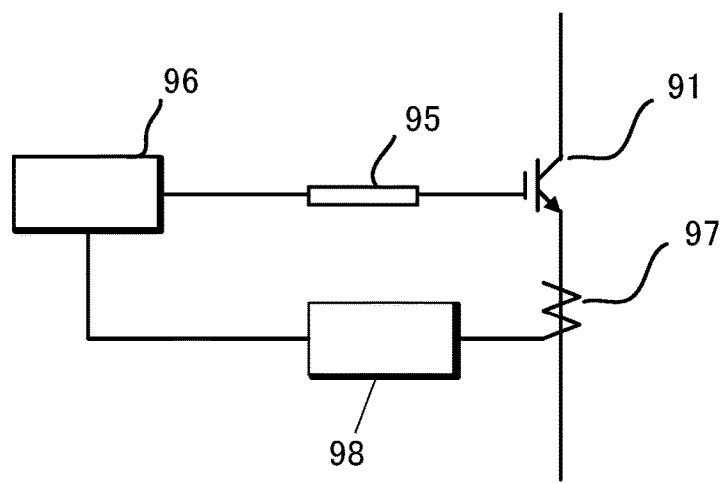
FIG. 17 is a circuit diagram of a configuration of a conventional short-circuit detector.
Figure 18:
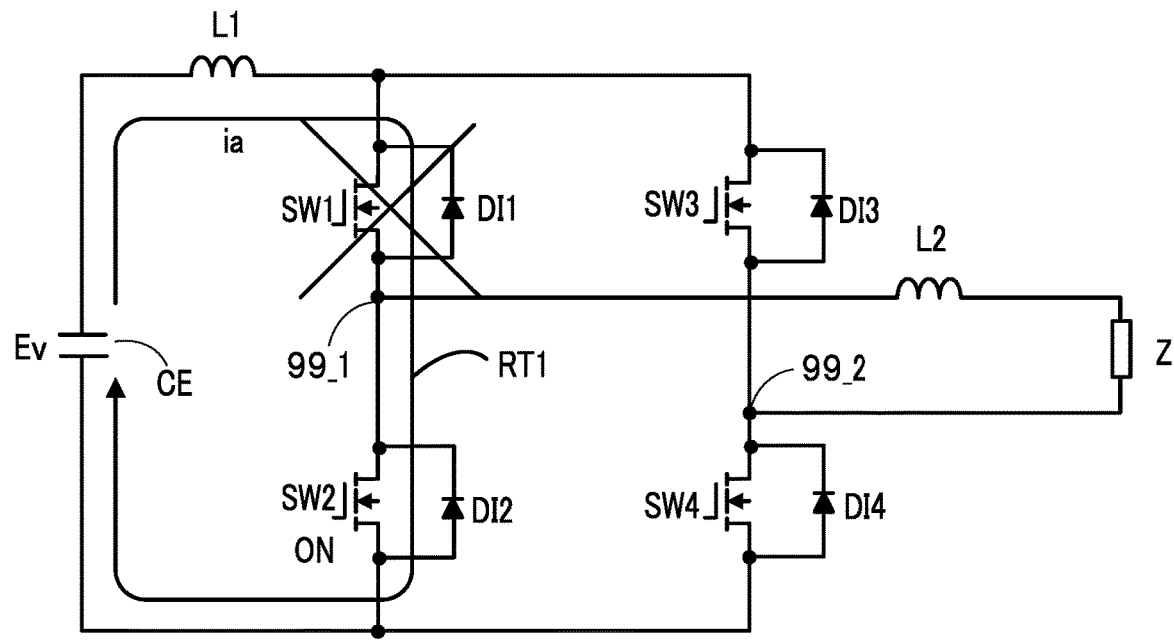
FIG. 18 is a circuit diagram showing a current route of an arm short-circuit in a power converter.
Figure 19:
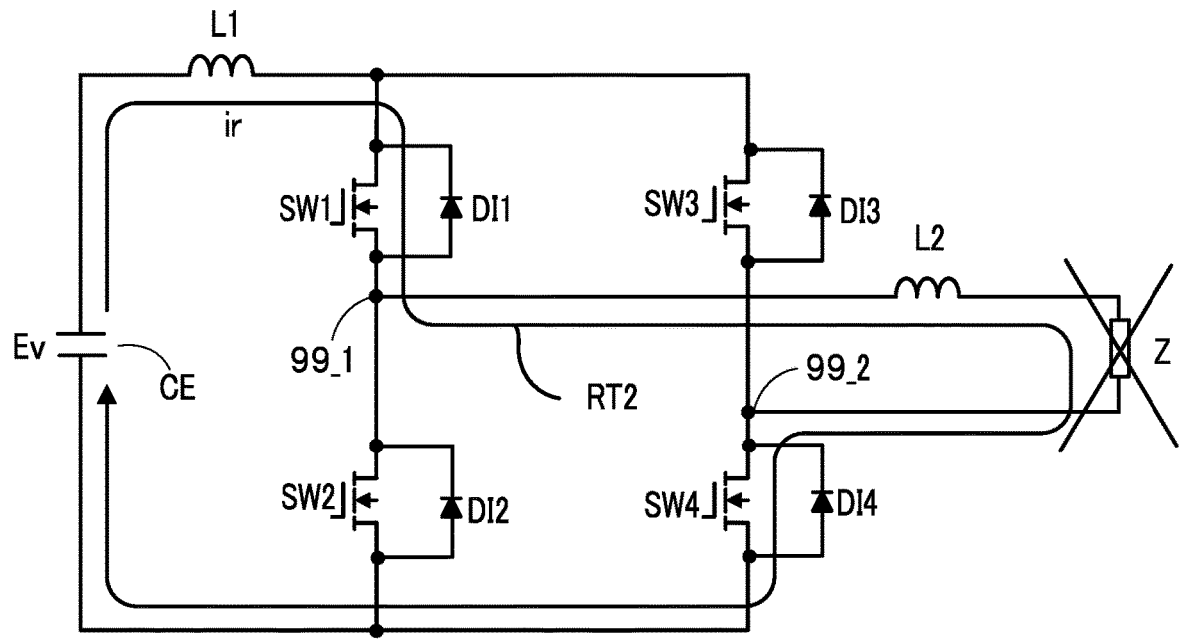
FIG. 19 is a circuit diagram showing a current route of a load short-circuit in the power converter.
Figure 20:
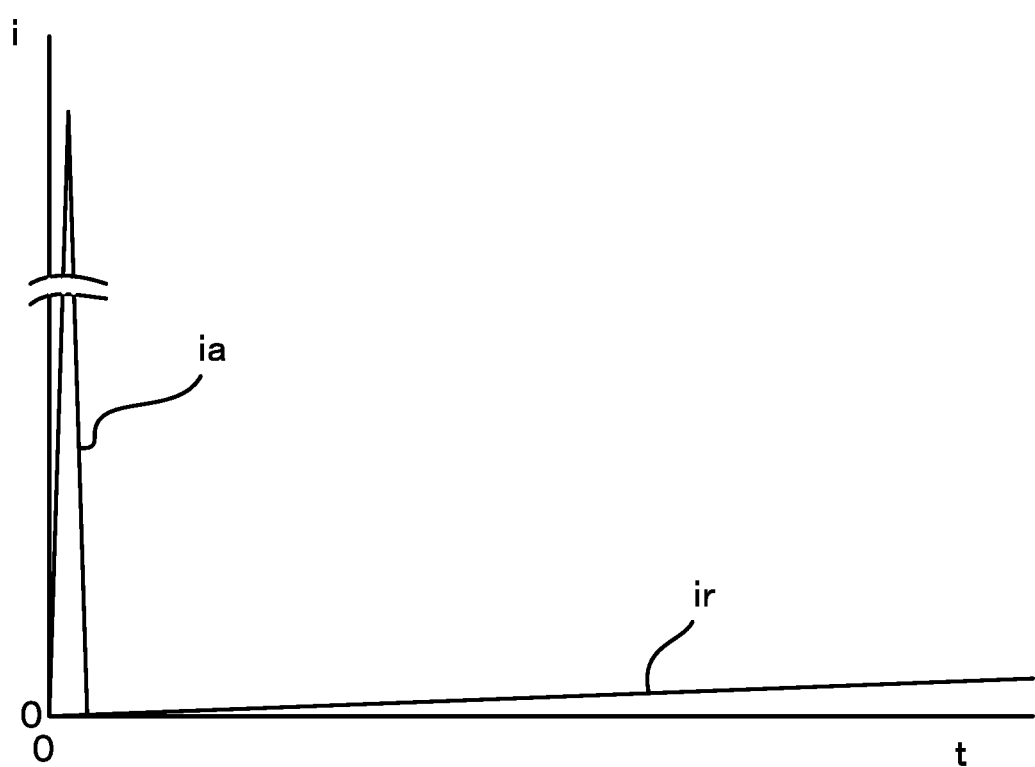
FIG. 20 shows waveforms of an arm short-circuit current and a load short-circuit current.

FIG. 16 is a circuit diagram showing an example of application of the short-circuit detector 100 according to the second embodiment to another power converter. FIG. 16 shows a buck chopper 122 as an application example. In FIG. 16, the parts corresponding to the parts shown in FIGS. 9 and 10 above are marked with the same sign.

In FIG. 16, an arm 10 includes a semiconductor switch 11 and a flywheel diode 12 connected in reverse parallel to the semiconductor switch 11. In this example, the semiconductor switch 11 is a MOSFET. The drain of the semiconductor switch 11 is connected to the positive electrode of the DC power supply 40 and either electrode of the capacitor 30 via the conductor 51. The source of the semiconductor switch 11 is connected to the cathode of the diode 302 via the conductor 52. The anode of the diode 302 is connected to the negative electrode of the DC power supply 40 and the other electrode of the capacitor 30. In other words, the diode 302 is connected in series to the arm 10. The load Za and a coil 301 are connected in series to each other. The diode 302 is connected in series to the coil 301 and the load Za. The gate drive circuit 20 supplies a gate signal to the semiconductor switch 11 to control the turning on and off thereof.

In the period during which the semiconductor switch 11 is ON, a current flows from the capacitor 30 to the load Za through the conductor 51, the semiconductor switch 11, the conductor 52, and the coil 301. When the semiconductor switch 11 is OFF, the electrical energy stored in the coil 301 is released. Then, the current flows in the loop including the coil 301, the load Za, and the diode 302. In this way, the buck chopper 122 as a power converter supplies power to the load Za through the arm 10 including the semiconductor switch 11.

In the configuration shown in FIG. 16, the conductor 52 between semiconductor switch 11 and diode 302 is inserted into the first Rogowski coil 101 and the second Rogowski coil 102. The first Rogowski coil 101 is optimized for detecting a load short-circuit current. The second Rogowski coil 102 is optimized for detecting a short-circuit current flowing through the arm 10 due to a short circuit in the diode 302.

On the bases of a second detection signal S2 obtained from the second Rogowski coil 102, the arm short-circuit detection circuit 112 detects that a short circuit of the diode 302 has occurred inside the buck chopper 122. Specifically, the arm short-circuit detection circuit 112 detects that a short circuit of the diode 302, when the second detection signal S2 is maintained at a level higher than the second reference level Vref2 beyond the second reference time Tref2. In this case, the arm short-circuit detection circuit 112 changes the short-circuit detection signal E2 from the inactive level "0" to the active level "1."

The load short-circuit detection circuit 111 detects that a load short circuit has occurred in the buck chopper 122, based on the first detection signal S1 obtained from the first Rogowski coil 101. Specifically, the load short-circuit detection circuit 111 detects that a load short circuit has occurred when the first detection signal S1 is maintained at a level higher than the first reference level Vref1 beyond the first reference time Tref1. In this case, the load short-circuit detection circuit 111 changes the short-circuit detection signal E1 from the inactive level "0" to the active level "1."

The interruption control circuit 121 detects whether any short circuit has occurred in the buck chopper 122 based on the short-circuit detection signals E1 and E2. In this case, the interruption control circuit 121 outputs an interruption signal C for stopping the driving of the semiconductor switch 11. In addition, the interruption control circuit 121 outputs a fault signal F to the control apparatus 1000 (see FIG. 9).

In the buck chopper 122, the same effects as those in the power converter 1A shown in FIG. 9 are obtained.

Modification of Second Embodiment

The second embodiment can be modified as described below.

(1) The second embodiment may be applied to other types of power converters, such as inverters other than three-phase or DC/DC converters other than buck choppers.

(2) In the second embodiment, an example has been given of MOSFETs as semiconductor switches. However, the semiconductor switches are not limited thereto, and they may be other types of semiconductor switches, such as IGBTs.

(3) In the second embodiment, the arm short-circuit detection circuit 112, the load short-circuit detection circuit 111, and the interruption control circuit 121 are separate. However, they may be a single circuit.

(4) In the configuration shown in FIG. 9, the power converter 1A includes three short-circuit detectors 100, which correspond to each of three arms 10 from among the six arms. However, as long as the number of short-circuit detectors 100 does not exceed the number P of arms 10, there are provided short-circuit detectors 100 for each of at least half of the arms 10. In other words, the number Q of arms 10 may be at least half of the total number P of the arms 10. As a result, the redundancy of the power converter 1A and the safety are enhanced.

(5) In the configuration shown in FIG. 9, the power converter 1A includes short-circuit detectors 100_2, 100_4 and 100_6 that correspond to respective arms 10_2, 10_4 and 10_6 (lower arms). Each short-circuit detector 100 includes both the first Rogowski coil 101 and the second Rogowski coil 102. As a result, the conditions 1 and 2 described above are satisfied.

However, this embodiment is not limited thereto. The power converter 1A may include a plurality of Q short-circuit detectors 100 that correspond to respective ones of a plurality of Q arms 10 from among a plurality of P arms. Each of the plurality of Q arms 10 may only include the first Rogowski coil 101. In addition, the power converter 1A may include a plurality of R short-circuit detectors 100 that correspond to respective ones of a plurality of R arms 10 from among the plurality of P arms 10. The plurality of R arms 10 differ from the plurality of Q arms 10. "R" is a positive integer that does not exceed (P-Q). However, each of the plurality of R short-circuit detectors only includes the second Rogowski coil. In other words, there may be provided two different types of short-circuit detectors for different arms 10. One of the two types is a short-circuit detector that only includes the first Rogowski coil 101. The other one is a short-circuit detector that only includes the second Rogowski coil 102. As a result, the conditions 1 and 2 may be satisfied.

Each of the plurality of Q short-circuit detectors 100 may include the interruption control circuit 121. Each of the plurality of R short-circuit detectors may include the interruption control circuit 121.

For example, there may be provided three short-circuit detectors 100, each only including the first Rogowski coil 101, for respective three upper arms 10 (e.g., 10_1, 10_3 and 10_5). The upper arms are disposed between the high power line and the load Z. Furthermore, there are provided three short-circuit detectors 100, each only including the second Rogowski coil 102, for respective lower arms 10 (e.g., 10_2, 10_4, and 10_6). The lower arms may be disposed between a low power line and the load Z. In this aspect, the conditions 1 and 2 may be satisfied.

DESCRIPTION OF REFERENCE SIGNS

100 . . . short-circuit detector; 30 . . . capacitor; 40 . . . DC power supply; 10_1 to 10_6, 10 . . . arm; 20_1 to 20_6, 20 . . . gate drive circuit; 100_1 to 100_6, 100 . . . short-circuit detector; 11, 11D . . . semiconductor switch; 12 . . . flywheel diode; 51, 53 . . . conductor; 101, 101A, 101B, 101C, 101D, 101E . . . first Rogowski coil; 102, 102A, 102B, 102C, 102D, 102E . . . second Rogowski coil; 41, 43 . . . first portion; 42, 44 . . . second portion; 70 . . . main circuit board; 61 . . . first layer circuit board; 62 . . . second layer circuit board; 63 . . . third layer circuit board; 111 . . . load short-circuit detection circuit; 112 . . . arm short-circuit detection circuit; 120 . . . short-circuit detection circuit; 121 . . . interruption control circuit; 122 . . . buck chopper; 103 . . . shield plate; Z . . . load

What is claimed is:

1. A short-circuit detector for a power converter including a plurality of arms, each including a semiconductor switch, the power converter supplying power to a load through the plurality of arms, the short-circuit detector comprising:
   a first Rogowski coil configured to generate a first detection signal in accordance with a load short-circuit current, the load short-circuit current being a current that flows through a first arm from among the plurality of arms due to a short circuit in the load;
   a second Rogowski coil configured to generate a second detection signal in accordance with an arm short-circuit current, the arm short-circuit current being a current that flows through the first arm due to:
      a short circuit in the first arm; or
      a short circuit in a second arm from among the plurality of arms;
   a load short-circuit detection circuit configured to detect the short circuit in the load, based on the first detection signal;
   an arm short-circuit detection circuit configured to detect the short circuit in the first arm or the short circuit in the second arm, based on the second detection signal; and
   a short-circuit detection circuit configured to detect a short-circuit, based on:
      an output signal output from the load short-circuit detection circuit; and
      an output signal output from the arm short-circuit detection circuit.

2. The short-circuit detector according to claim 1, wherein a number of turns of the first Rogowski coil is greater than that of the second Rogowski coil.

3. The short-circuit detector according to claim 1, wherein a cross-sectional area of the first Rogowski coil is greater than that of the second Rogowski coil.

4. The short-circuit detector according to claim 1, wherein a magnetic path length of the first Rogowski coil is shorter than that of the second Rogowski coil.

5. The short-circuit detector according to claim 1, wherein at least one of the first Rogowski coil or the second Rogowski coil is disposed in a circuit board.

6. The short-circuit detector according to claim 1, wherein (i) the second Rogowski coil, (ii) a semiconductor switch included in the first arm, and (iii) the first Rogowski coil are disposed in a listed order or in a reverse order, in a current route through the first arm.

7. The short-circuit detector according to claim 1, further comprising a shield disposed between the first Rogowski coil and the second Rogowski coil.

8. The short-circuit detector according to claim 1, wherein the first arm and the second arm are connected in series to each other.

9. A power converter supplying power to a load through a plurality of arms, each including a semiconductor switch, the power converter comprising:
   a first Rogowski coil configured to generate a first detection signal in accordance with a load short-circuit current, the load short-circuit current being a current that flows through a first arm from among a plurality of arms due to a short circuit in the load;
   a second Rogowski coil configured to generate a second detection signal in accordance with an arm short-circuit current, the arm short-circuit current being a current that flows through the first arm due to:
      a short circuit in the first arm; or
      a short circuit in a second arm from among the plurality of arms;
   a load short-circuit detection circuit configured to detect the short circuit in the load, based on the first detection signal;
   an arm short-circuit detection circuit configured to detect the short circuit in the first arm or the short circuit in the second arm, based on the second detection signal;
   a short-circuit detection circuit configured to detect a short-circuit, based on:
      an output signal output from the load short-circuit detection circuit; and
      an output signal output from the arm short-circuit detection circuit; and
   a gate drive circuit configured to stop driving a semiconductor switch included in the first arm, based on a short-circuit detection signal output from the short-circuit detection circuit.

10. A power converter for supplying power to a load through a plurality of P (P is an integer of 2 or more) arms, each including a semiconductor switch, the power converter comprising:
    a plurality of Q (Q is a positive integer that is less than P) short-circuit detector that correspond to respective ones of a plurality of Q arms from among the plurality of P arms,
    wherein each of the plurality of Q short-circuit detectors is configured to:
       include a first Rogowski coil that is configured to output a first detection signal in accordance with a current flowing through a corresponding arm due to a short circuit in the load, and
       detect a short circuit based on the first detection signal.

11. The power converter according to claim 10, wherein each of the plurality of Q short-circuit detectors is configured to:
    further include a second Rogowski coil that is configured to output a second detection signal in accordance with a current flowing through the corresponding arm due to:
       a short circuit in the corresponding arm; or
       a short circuit in another arm from among the plurality of P arms; and
    detect a short circuit based on the second detection signal.

12. The power converter according to claim 10, further comprising a plurality of R (R is a positive integer that does not exceed (P-Q)) short-circuit detectors that correspond to respective ones of a plurality of R arms from among the plurality of P arms, the plurality of R arms differing from the plurality of Q arms,
    wherein each of the plurality of R short-circuit detectors is configured to:
       include a second Rogowski coil that is configured to output a second detection signal in accordance with a current flowing through the corresponding arm due to:
          a short circuit in the corresponding arm; or
          a short circuit in another arm from among the plurality of P arms, and
       detect a short circuit based on the second detection signal.

13. The power converter according to claim 11, wherein the Q is at least half of the P.

14. The power converter according to claim 11, wherein (i) the second Rogowski coil, (ii) a semiconductor switch included in the corresponding arm, and (iii)

the first Rogowski coil are disposed in a listed order or in a reverse order, in a current route through the corresponding arm.

15. The power converter according to claim 11,
wherein each of the plurality of Q short-circuit detectors is configured to include an interruption control circuit that is configured to, in response to detecting a short circuit, stop driving:
 a semiconductor switch of the corresponding arm; and
 a semiconductor switch of another arm for which none of the plurality of Q short-circuit detectors are provided.

16. The power converter according to claim 12,
wherein each of the plurality of Q short-circuit detectors is configured to include an interruption control circuit that is configured to, in response to detecting a short circuit, stop driving:
 a semiconductor switch of the corresponding arm, and
 a semiconductor switch of another arm for which none of the plurality of Q short-circuit detectors are provided, and
wherein each of the plurality of R short-circuit detectors is configured to include an interruption control circuit that is configured to, in response to detecting a short circuit, stop driving:
 a semiconductor switch of the corresponding arm; and
 a semiconductor switch of another arm for which none of the plurality of R short-circuit detectors are provided.

17. The power converter according to claim 11,
wherein the corresponding arm and the other arm are connected in series to each other.

18. A power converter for supplying power to a load through an arm including a semiconductor switch, the power converter comprising:
 a first Rogowski coil that is configured to output a first detection signal in accordance with a current flowing through the arm due to a short circuit in the load;
 a second Rogowski coil that is configured to output a second detection signal in accordance with a current flowing through the arm due to a short circuit in a diode connected in series to the arm; and
 a short-circuit detector configured to detect a short circuit based on the first detection signal or the second detection signal.

* * * * *